(12) United States Patent
Murata et al.

(10) Patent No.: US 9,957,616 B2
(45) Date of Patent: May 1, 2018

(54) SUBSTRATE PROCESSING APPARATUS AND HEATING UNIT

(71) Applicant: HITACHI KOKUSAI ELECTRIC INC., Tokyo (JP)

(72) Inventors: Hitoshi Murata, Toyama (JP); Yuichi Wada, Toyama (JP); Takashi Yahata, Toyama (JP); Hidenari Yoshida, Toyama (JP); Shuhei Saido, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days. days.

(21) Appl. No.: 15/051,740

(22) Filed: Feb. 24, 2016

(65) Prior Publication Data

US 2016/0244878 A1    Aug. 25, 2016

(30) Foreign Application Priority Data

Feb. 25, 2015 (JP) ................................. 2015-035845
Dec. 25, 2015 (JP) ................................. 2015-253777

(51) Int. Cl.
*C23C 16/46* (2006.01)
*C23C 16/52* (2006.01)
(Continued)

(52) U.S. Cl.
CPC .............. *C23C 16/46* (2013.01); *C23C 16/52* (2013.01); *H01L 21/67109* (2013.01); *H05B 1/0233* (2013.01); *H05B 3/0047* (2013.01)

(58) Field of Classification Search
None
See application file for complete search history.

(56) References Cited

U.S. PATENT DOCUMENTS 3,783,822 A * 1/1974 Wollam .............. C23C 16/4584
                                                    118/725
6,444,940 B1   9/2002 Saito et al.
(Continued)

FOREIGN PATENT DOCUMENTS

JP          2583503 B2    2/1997
JP       2001-156005 A    6/2001
(Continued)

OTHER PUBLICATIONS

Korean Office Action dated Jan. 20, 2017 in the Korean Application No. 10-2016-0017774.
(Continued)

*Primary Examiner* — Jethro M Pence
(74) *Attorney, Agent, or Firm* — Volpe and Koenig, P.C.

(57) ABSTRACT

The present invention is directed providing a technique capable of reducing a time for stabilizing a temperature in a processing chamber. The technique includes: a substrate support configured to support a substrate; a thermal insulation unit disposed below the substrate support; a processing chamber configured to accommodate the substrate support and where the substrate is processed; a first heating unit disposed around the processing chamber and configured to heat an inside of the processing chamber from a lateral side thereof; and a second heating unit disposed between the substrate support and the thermal insulation unit inside the processing chamber, the second heating unit including a heater having a substantially annular shape and a suspending member extending downward from the heater, wherein a diameter of the heater is smaller than that of the substrate.

10 Claims, 19 Drawing Sheets

(51) Int. Cl.
  *H05B 3/44*   (2006.01)
  *H05B 1/02*   (2006.01)
  *H01L 21/67*  (2006.01)
  *H05B 3/00*   (2006.01)

(56) References Cited

U.S. PATENT DOCUMENTS

2005/0217799 A1  10/2005  O'Meara et al.
2012/0000425 A1  1/2012   Park et al.

FOREIGN PATENT DOCUMENTS

| JP | 3423131 B2    | 7/2003  |
| JP | 2006-100755 A | 4/2006  |
| TW | 200540937 A   | 12/2005 |
| TW | 201201305 A1  | 1/2012  |

OTHER PUBLICATIONS

Taiwanese Office Action dated Jan. 5, 2017 in the Taiwanese Application No. 105100685.

* cited by examiner

SUBSTRATE PROCESSING APPARATUS AND HEATING UNIT

CROSS-REFERENCE TO RELATED PATENT APPLICATION

This non-provisional U.S. patent application claims priority under 35 U.S.C. § 119 of Japanese Patent Application No. 2015-035845, filed on Feb. 25, 2015 and Japanese Patent Application No. 2015-253777, filed on Dec. 25, 2015, the entire contents of which are hereby incorporated by reference.

BACKGROUND OF THE INVENTION

1. Field of the Invention

The present invention relates to a substrate processing apparatus, a method of manufacturing a semiconductor device and a heating unit.

2. Description of the Related Art

As a substrate processing apparatus, there is a batch-type substrate processing apparatus for processing a predetermined number of substrates at once. In the batch-type substrate processing apparatus, the predetermined number of substrates are held on a substrate support, the substrate support is loaded into a processing chamber, a process gas is introduced into the processing chamber while heating the substrates, and thus a desired process is performed.

Conventionally, a substrate in a processing chamber is heated from a side by a heater installed so as to surround the processing chamber. However, specifically, a center portion of the substrate located on a lower portion in the processing chamber is difficult to be heated and a temperature thereof is easily lowered. Thus, in the conventional substrate processing apparatus, there is a problem in that it takes time for increasing a temperature in the processing chamber and a recovery time (temperature stabilization time) is increased.

RELATED ART DOCUMENT

Patent Document

1. Japanese Patent Application No. 3598032

The present invention provides a technique capable of reducing a time for stabilizing a temperature in a processing chamber.

SUMMARY OF THE INVENTION

According to an aspect of the present invention, there is provided a technique including: a substrate support configured to support a substrate; a thermal insulation unit disposed below the substrate support; a processing chamber configured to accommodate the substrate support and where the substrate is processed; a first heating unit disposed around the processing chamber and configured to heat an inside of the processing chamber from a lateral side thereof; and a second heating unit disposed between the substrate support and the thermal insulation unit inside the processing chamber, the second heating unit including a heater having a substantially annular shape and a suspending member extending downward from the heater, wherein a diameter of the heater is smaller than that of the substrate.

DETAILED DESCRIPTION OF THE PREFERRED EMBODIMENTS

Hereinafter, an embodiment of the present invention will be described with reference to the drawings.

Figure 1:
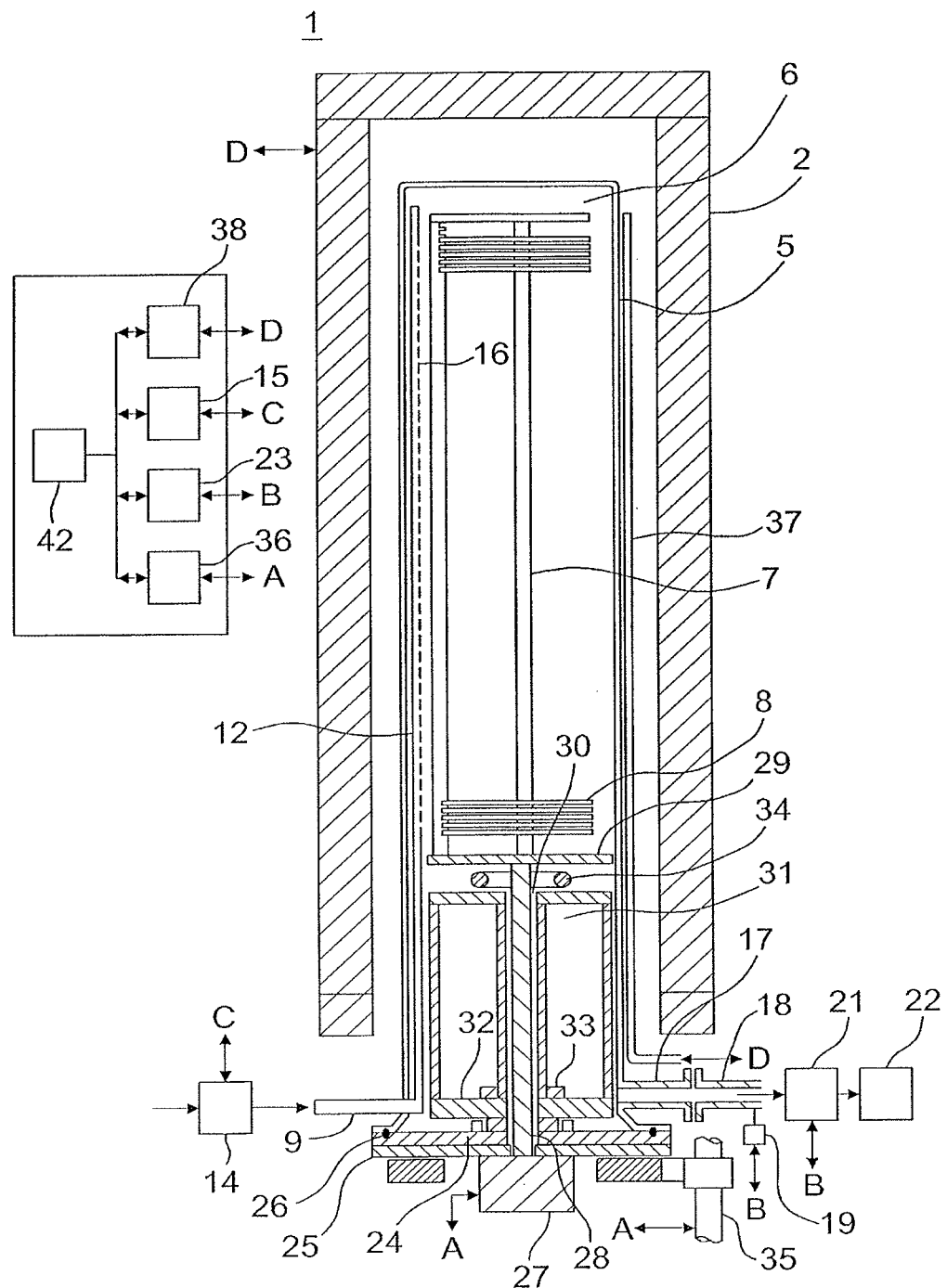
FIG. 1 is a side sectional view illustrating a processing furnace of a substrate processing apparatus preferably used in a first embodiment of the present invention.

As illustrated in FIG. 1, a processing furnace 1 includes a lateral side heater 2 serving as a first heating unit having a cylindrical shape. In the lateral side heater 2, a reaction tube 5, which is made of a heat-resistant material such as quartz ($SiO_2$) and having a cylindrical shape of which an upper end is closed and a lower end is open, is concentrically installed with respect to the lateral side heater 2.

A processing chamber 6 is formed by an inside of the reaction tube 5, and a boat 7 serving as a substrate support is accommodated in the processing chamber 6. The boat 7 is configured to hold wafers 8 serving as substrates in a state of being vertically arranged in a multiple stages in a horizontal posture. The boat 7 is made of, for example, quartz, silicon carbide or the like.

Figure 19:
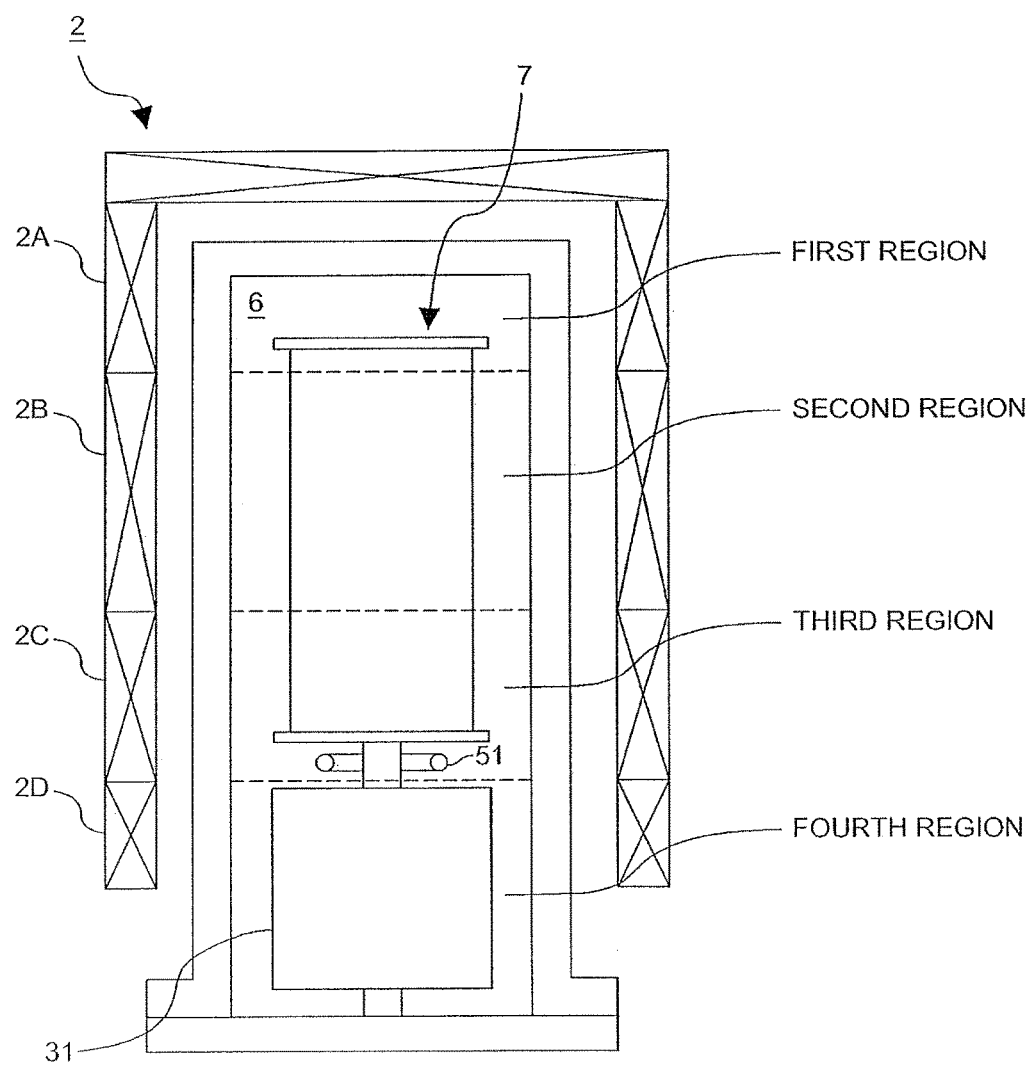
FIG. 19 is a schematic configuration diagram illustrating the substrate processing apparatus preferably used in the first embodiment of the present invention.

In the present embodiment, as illustrated in FIG. 19, the processing chamber 6 is divided into four regions of a first region, a second region, a third region and a fourth region from the top. The lateral side heater 2 is divided into first to fourth heaters respectively corresponding to the regions. A first heater 2A is installed in the vicinity of the first region, a second heater 2B is installed in the vicinity of the second region, a third heater 2C is installed in the vicinity of the third region, and a fourth heater 2D is installed in the vicinity of an upper portion of the fourth region. In the processing chamber 6, the boat 7 is accommodated across the first region to the third region, and a thermal insulation unit 31 to be described below is accommodated in the fourth region. Since the regions (a product region) in which the boat 7 is accommodated are heated by the first to third heaters, the third first to third heaters may be collectively referred to as an upper heater which heats the product region. In addition, since a region (an insulation region) in which the thermal insulation unit 31 is accommodated is heated by the fourth heater 2D, the fourth heater 2D may be referred to as a lower heater which heats the insulation region.

As illustrated in FIG. 1, a gas inlet 9 is installed at a lower end portion of the reaction tube 5 so as to pass through the reaction tube 5. A nozzle 12 serving as a gas inlet pipe which stands along an inner wall of the reaction tube 5 is connected to the gas inlet 9. A plurality of gas inlet holes 16 are installed in a direction of a side surface of the nozzle 12, that is, in a direction facing the wafers 8. A process gas is introduced into the processing chamber 6 through the gas inlet holes 16.

A source gas supply source, a carrier gas supply source, a reaction gas supply source and an inert gas supply source (not illustrated) are connected to an upstream side of the gas inlet 9 through a mass flow controller (MFC) 14 serving as a gas flow rate controller. A gas flow rate control unit 15 is electrically connected to the MFC 14. The gas flow rate control unit 15 is configured to control such that a flow rate of supplied gas is a desired rate at a desired timing.

An exhaust unit 17 which exhausts an atmosphere in the processing chamber 6 is installed at a position different from that of the gas inlet 9 installed at the lower end portion of the reaction tube 5, and an exhaust pipe 18 is connected to the exhaust unit 17. A pressure sensor 19 serving as a pressure detector (pressure detecting unit) which detects a pressure in the processing chamber 6 is installed at the exhaust pipe 18. A vacuum pump 22 serving as a vacuum exhaust device is connected to the pressure sensor 19 through an auto pressure controller (APC) valve 21 serving as a pressure regulator (pressure regulating unit).

A pressure control unit 23 is electrically connected to the APC valve 21 and the pressure sensor 19. The pressure control unit 23 is configured to control the APC valve 21 such that a pressure in the processing chamber 6 is a desired pressure at a desired timing by the APC valve 21 based on a pressure detected by the pressure sensor 19.

A base 24 serving as a retainer capable of air-tightly sealing a lower opening of the reaction tube 5 and a seal cap 25 serving as a furnace port cover are installed in the lower end portion of the reaction tube 5. The seal cap 25 is made of, for example, a metal such as stainless or the like. The base 24 having a disk shape is made of, for example, quartz, and is installed on the seal cap 25 to be polymerized. An O-ring 26 serving as a sealing member that abuts a lower end of the reaction tube 5 is installed on an upper surface of the base 24. A rotating mechanism 27 which rotates the boat 7 is installed under the seal cap 25. A bottom plate 29 of the boat 7 is fixed to an upper end of a rotary shaft 28 of the rotating mechanism 27.

The thermal insulation unit 31 is installed under the boat 7. The thermal insulation unit 31 is configured so that a bottom plate 32 is tightly supported by pressing plates 33 made of quartz. As the bottom plate 32 is restrained between the pressing plates 33, the thermal insulation unit 31 is configured to prevent the thermal insulation unit 31 from being reversed. The thermal insulation unit 31 is formed, for example, in a cylindrical shape made of a heat-resistant material such as quartz, silicon carbide or the like.

A thermal insulation plate (not illustrated) made of a heat-resistant material such as quartz, silicon carbide or the like is stacked in an inside of the thermal insulation unit 31. A thermal insulation plate thereinside may be referred to as the thermal insulation unit 31. The fourth heater is configured to heat an upper portion of the thermal insulation unit 31. According to such a configuration, as the upper portion of the thermal insulation unit 31 is heated, the temperature controllability in the bottom region may be obtained. Meanwhile, a lower portion of the thermal insulation unit 31 is not directly heated. Therefore, heat from the lateral side heater 2 and the cap heater 34 is insulated by the thermal insulation unit 31, and thus the heat is not easily transferred to a furnace port portion which is the lower end of the reaction tube 5.

A hole 30 is formed at a center portion of the thermal insulation unit 31 to pass through over an entire length of the thermal insulation unit 31 in a vertical direction. The rotary shaft 28 is inserted into and passes through the hole 30, and the rotary shaft 28 passes through the seal cap 25 and the base 24 and is connected to the boat 7. The boat 7 is independently rotated on the thermal insulation unit 31 by the rotating of the rotary shaft 28.

The seal cap 25 is configured to be vertically moved upward and downward by a boat elevator 35 serving as a lifting mechanism that is vertically installed outside of the reaction tube 5, and the boat 7 may be loaded into and unloaded from the processing chamber 6 by the seal cap 25.

The cap heater 34 serving as a second heating unit including a heater 51 to be described below is installed in a space between the boat 7 and the thermal insulation unit 31. The cap heater 34 is installed such that the heater 51 is located at a position equal to or higher than that of a boundary between the third heater and the fourth heater. In other words, the cap heater 34 is installed such that the heater 51 is located at a position equal to or higher than that of a boundary between the product region and the insulation region. When the cap heater 34 is installed at these locations, it is possible to efficiently heat a lower portion of the product region [a bottom region in which a bottom wafer of the boat 7 is placed].

The cap heater 34 may include a structure in which a resistive heating element is air-tightly encapsulated in a quartz tube serving as a protecting tube. The heater 51 of the cap heater 34 has a substantially (approximately) annular shape. In such a configuration, in the bottom region, for example, a lowermost wafer 8 may be heated in an annular shape. That is, a portion of the lowermost wafer 8 facing the heater 51 may be intensively heated. In other words, without heating a central region of the lowermost wafer 8, an outer region thereof rather than the central region may be heated. In addition, since the cap heater 34 preferably has strength capable of withstanding a pressure when a pressure in the processing chamber 6 is decreased, a thickness of the protecting tube of the cap heater 34 may be reduced, and a vertical thickness of the protecting tube of the cap heater 34 may be reduced.

A first temperature sensor 37 serving as a first temperature detector is installed between the lateral side heater 2 and the reaction tube 5. In addition, a second temperature sensor 39 serving as a second temperature detector is installed to be in contact with a surface of the protecting tube of the cap heater 34. Here, the second temperature sensor 39 is installed to be in contact with an upper surface of the protecting tube (see FIG. 7). The second temperature sensor 39 has a structure in which a temperature detector such as a thermocouple or the like is accommodated in the protecting tube.

By adjusting power supply to the lateral side heater 2 based on information on a temperature detected by the first temperature sensor 37 and by adjusting power supply to the cap heater 34 based on information on a temperature detected by the second temperature sensor 39, a temperature control unit 38 is configured to control the lateral side heater 2 and the cap heater 34 such that the processing chamber 6 has a desired temperature distribution at a desired timing. The gas flow rate control unit 15, the pressure control unit 23, a driving control unit 36 and the temperature control unit 38 are electrically connected to a controller 42 serving as a main control unit for controlling the entire substrate processing apparatus.

Figure 2:
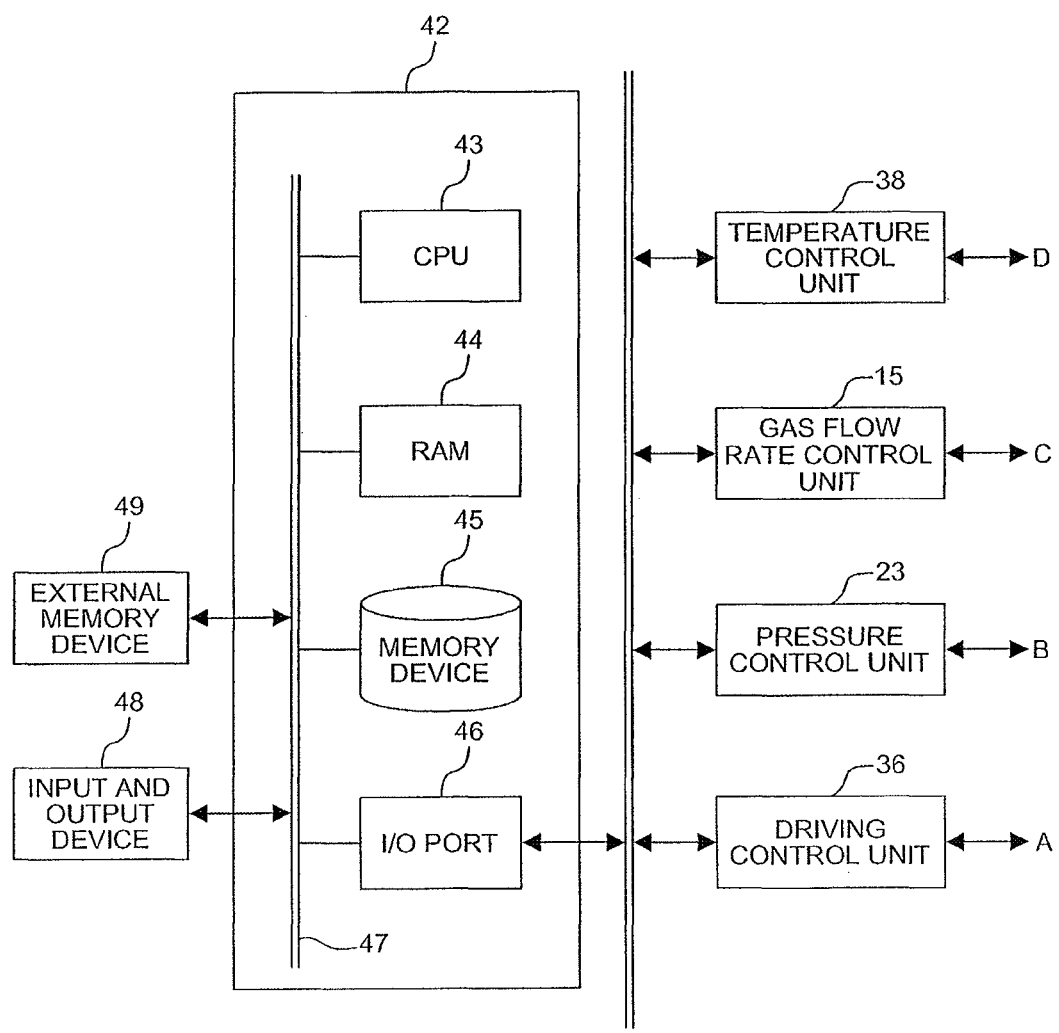
FIG. 2 is a schematic configuration diagram illustrating a control system of the substrate processing apparatus according to the first embodiment of the present invention.

As illustrated in FIG. 2, the controller 42 serving as a control unit (control device) may be embodied by a computer that includes a central processing unit (CPU) 43, a random access memory (RAM) 44, a memory device 45 and an input-and-output (I/O) port 46. The RAM 44, the memory device 45 and the I/O port 46 are configured to exchange data with the CPU 43 through an internal bus 47. An I/O device 48, which may be embodied by a touch panel, is connected to the controller 42.

The memory device 45 may be embodied by a flash memory, a hard disk drive (HDD) or the like. A control program for controlling operations of the substrate processing apparatus, a process recipe describing sequences or conditions of substrate processing (to be described below) and the like are readably stored in the memory device 45. The process recipe, which is a combination of sequences, causes the controller 42 to execute each sequence in the substrate processing process to be described below in order to obtain a predetermined result, serves as a program.

Hereinafter, such a process recipe, a control program and the like are collectively and simply called a "program." When the term "program" is used in this specification, it may refer to one or both of the process recipe and the control program. The RAM 44 is an memory area (work area) in which a program, data and the like read by the CPU 43 are temporarily stored.

The I/O port 46 is connected to the above-described gas flow rate control unit 15, pressure control unit 23, driving control unit 36 and temperature control unit 38. The CPU 43 reads and executes the control program from the memory device 45 and reads the recipe from the memory device 45 according to an input of a manipulating command from the I/O device 48. To comply with the contents of the read process recipe, the CPU 43 is configured to control a flow rate adjusting operation of various types of gases by the gas flow rate control unit 15, a pressure adjusting operation by the pressure control unit 23, starting or stopping of the exhaust device 22, adjusting operations of temperatures of the lateral side heater 2 and the cap heater 34 by the temperature control unit 38, a rotation operation, a rotational speed adjusting operation and a lifting and lowering operation of the boat 7 by the driving control unit 36 and the like.

The controller 42 may be configured by installing the above-described program stored in an external memory device 49 [for example, a magnetic tape, a magnetic disk such as a flexible disk and a hard disk, an optical disc such as a compact disc (CD) and a digital video disc (DVD), a magneto-optical disc such as an MO disc, and a semiconductor memory such as a Universal Serial Bus (USB) memory and a memory card] in the computer. The memory device 45 or the external memory device 49 may be embodied by a non-transitory computer-readable recording medium. Hereinafter, these are also collectively and simply called a recording medium. When the term "recording medium" is used in this specification, it may refer to one or both of the memory device 45 and the external memory device 49. In addition, a communication line such as the Internet or a dedicated line may be used to supply the program without using the external memory device 49.

Next, using the processing furnace 1 according to the configuration, as a process of processes of manufacturing a semiconductor device, a method of performing a substrate processing (hereinafter, referred to simply as a film forming) in which oxidation processing, diffusion processing, film forming and the like are performed on the wafer 8 will be described. Here, an example of forming a film on the wafer 8 by alternately supplying a first process gas (a source gas) and a second process gas (a reaction gas) onto the wafer 8 will be described. In addition, in the following description, operations of respective units constituting the substrate processing apparatus are controlled by the controller 42.

When a predetermined number of wafers 8 are loaded onto the boat 7 (wafer charging), the boat 7 is loaded into the processing chamber 6 by the boat elevator 35 (boat loading). In this state, the seal cap 25 air-tightly closes the lower opening (furnace port portion) of the reaction tube 5 through the base 24 and the O-ring 26. In this case, the cap heater 34 may be heated and maintained to a predetermined temperature (a first temperature). In this case, the first temperature may be a lower than that of the lateral side heater 2 (at least a temperature of the fourth heater).

The processing chamber 6 is vacuum-exhausted (exhausted to a reduced pressure) by the exhaust device 22 such that the pressure in the processing chamber 6 reaches a desired pressure. In this case, the pressure in the processing chamber 6 is measured by the pressure sensor 19, and the APC valve 21 is feedback controlled based on the measured pressure.

In addition, the processing chamber 6 is heated by the lateral side heater 2 and the cap heater 34 such that the wafer 8 in the processing chamber 6 reaches a desired temperature. In this case, power supply to the lateral side heater 2 is feedback controlled based on information on the temperature detected by the first temperature sensor 37 such that an inside of the processing chamber 6 reaches a desired temperature distribution, and power supply to the cap heater 34 is feedback controlled based on information on the temperature detected by the second temperature sensor 39. In this case, the temperature of the cap heater 34 may be equal to or lower than that of the lateral side heater 2 (at least the temperature of the fourth heater). Here, when the temperature of the wafer 8 of the bottom region in the processing chamber 6 reaches a desired temperature, the heating by the cap heater 34 may be stopped.

Next, when the boat 7 is rotated by the rotating mechanism 27 through the bottom plate 29, the being processed wafer 8 is rotated. In this case, since the rotary shaft 28 is inserted into and passes through the hole 30, only the boat 7 is rotated with respect to the thermal insulation unit 31. Even when the cap heater 34 has a substantially (approximately) annular shape, the annular-shaped region of the bottom region may be uniformly heated by the rotating of the boat 7.

(Source Gas Supply Process)

Next, a source gas is supplied from the source gas supply source into the processing chamber 6. The source gas is controlled by the MFC 14 to be a desired flow rate, flows from the gas inlet 9 through the nozzle 12, and is introduced into the processing chamber 6 through the gas inlet holes 16.

(Source Gas Exhausting Process)

When a predetermined source gas supply time has elapsed, the supply of the source gas into the processing chamber 6 is stopped, and the inside of the processing chamber 6 is vacuum-exhausted by the exhaust device 22. In this case, an inert gas may be supplied from the inert gas supply source into the processing chamber 6 (inert gas purging).

(Reaction Gas Supply Process)

When a predetermined exhaust time has elapsed, a reaction gas is supplied from the reaction gas supply source. The reaction gas controlled by the MFC 14 to be the desired flow rate flows from the gas inlet 9 through the nozzle 12, and is introduced into the processing chamber 6 through the gas inlet holes 16.

(Reaction Gas Exhausting Process)

In addition, when a predetermined processing time has elapsed, the supply of the reaction gas into the processing chamber 6 is stopped, and the inside of the processing chamber 6 is vacuum-exhausted by the exhaust device 22. In this case, an inert gas may be supplied from the inert gas supply source into the processing chamber 6 (inert gas purging).

When the above-described four processes are asynchronously performed, that is, non-simultaneously, a predetermined number of times (n times) of a cycle, a film having a predetermined composition and a predetermined film thickness may be formed on the wafer 8. In addition, the above-described cycle is preferably repeated multiple times.

After the film having the predetermined film thickness is formed, an inert gas is supplied from the inert gas supply source, the inside of the processing chamber 6 is replaced with the inert gas, and the pressure in the processing chamber 6 is restored to a normal pressure. Then, the seal cap 25 is lowered by the boat elevator 35, the furnace port portion is open, and the processed wafer 8 is unloaded from the reaction tube 5 while being held on the boat 7 (boat unloading). Then, the processed wafer 8 is extracted from the boat 7 (wafer discharging). In this case, the heating by the cap heater 34 is stopped.

In addition, process conditions where a dichlorosilane (DCS, $SiH_2Cl_2$) gas is used as a source gas, and $O_2$ gas is used as a reaction gas, and $N_2$ gas is used as an inert gas to form an oxide film on the wafer 8 by the processing furnace 1 of the present embodiment are as follows:

Process temperature (wafer temperature): ranging from 300° C. to 700° C.

Process pressure (pressure in the processing chamber): ranging from 1 Pa to 4,000 Pa Flow rate of DCS gas: ranging from 100 sccm to 10,000 sccm Flow rate of $O_2$ gas: ranging from 100 sccm to 10,000 sccm Flow rate of $N_2$ gas: ranging from 100 sccm to 10,000 sccm As each of the process conditions is of a value in each range, it is possible to appropriately perform the film forming process.

Next, when a diameter of the wafer 8 is 300 mm for example, a relationship between a location heated by the cap heater 34 with respect to radius and a temperature distribution of a lower portion (bottom region) of the processing chamber 6 will be described.

Figure 3A:
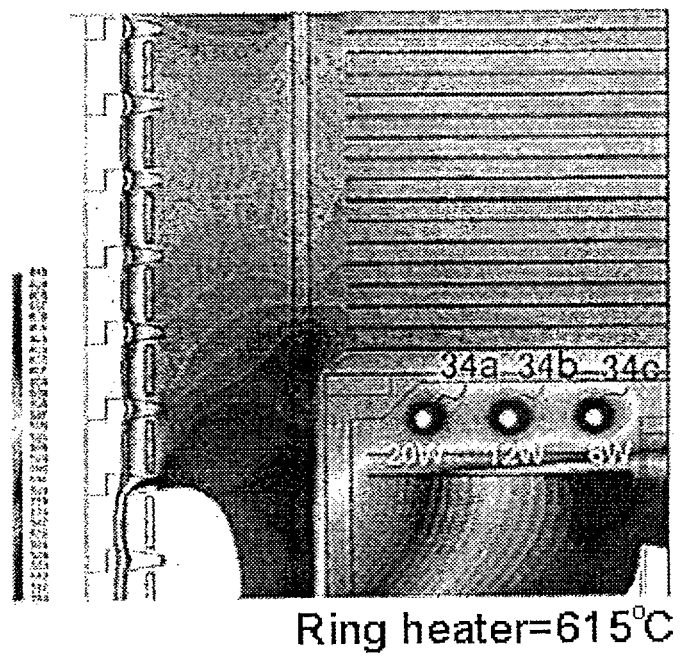
FIG. 3A is a view illustrating simulation results of a temperature distribution when an entire bottom region of a processing chamber is heated at the same temperature in the substrate processing apparatus according to the first embodiment of the present invention.
Figure 3B:
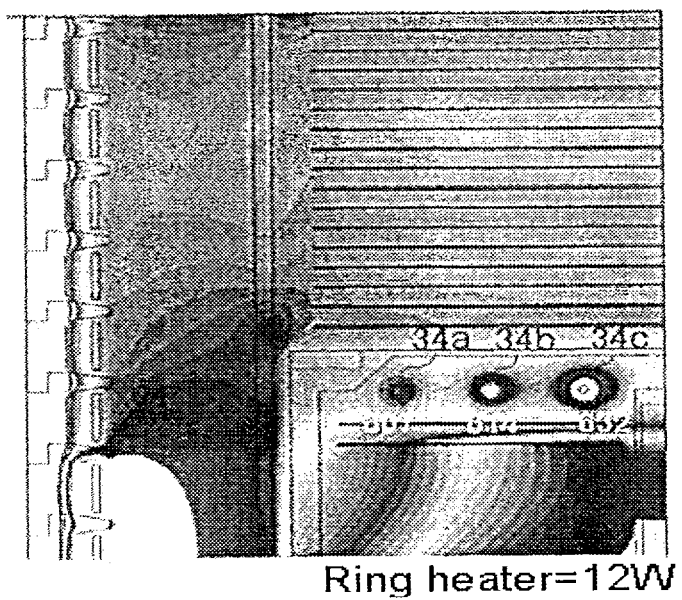
FIG. 3B is a view illustrating simulation results of a temperature distribution when the entire bottom region of the processing chamber is heated with the same output in the substrate processing apparatus according to the first embodiment of the present invention.

FIGS. 3A and 3B illustrate simulation results of a temperature distribution when an entire bottom region of the processing chamber is heated (a conventional example), in the substrate processing apparatus according to the first embodiment of the present invention. As the case of heating the entire bottom region, a simulation in which a plurality of cap heaters 34, three cap heaters 34 for example are concentrically installed in a multiple manner with respect to each other has been performed.

Figure 4:
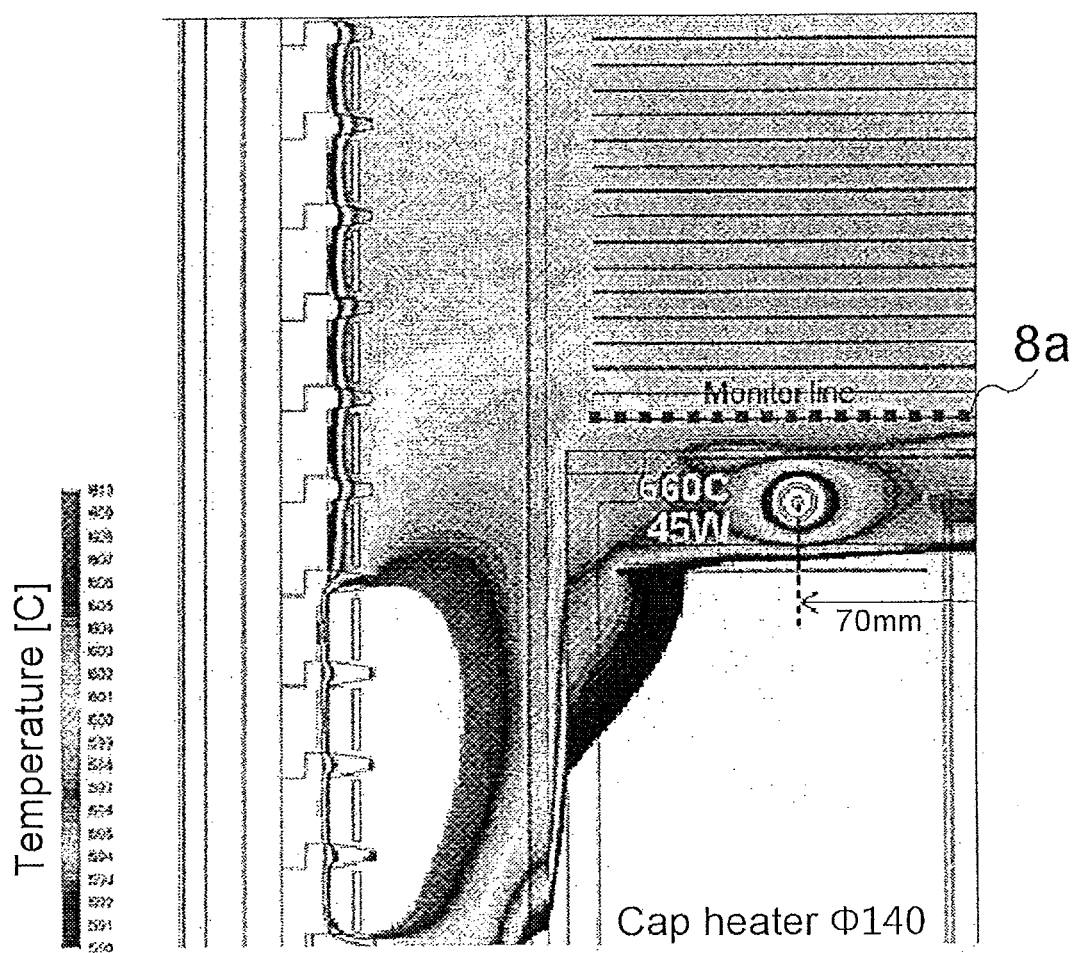
FIG. 4 is a view illustrating simulation results of a temperature distribution when a portion corresponding to a substantially (approximately) middle portion of a radius of a substrate in the bottom region of the processing chamber is heated by a cap heater according to the first embodiment of the present invention.

In addition, FIG. 4 illustrates simulation results of a temperature distribution when a portion of the bottom region of the processing chamber is heated in an annular shape (the present invention), in the substrate processing apparatus according to the first embodiment. In addition, FIG. 4 illustrates a temperature distribution when a heated location is 70 mm away from the center of the processing chamber 6, i.e., when a diameter of the cap heater 34 is 140 mm.

As illustrated in FIGS. 3A and 3B, when the temperatures of the cap heaters 34a through 34c in the bottom region are the same at 615° C. and thermal power of the cap heaters 34a through 34c are the same at 12 W, a temperature distribution in which a temperature of the outer circumference of the bottom region is high and a temperature of a center portion thereof is low occurs, and a maximum surface temperature difference of the wafer 8 becomes about 4° C. That is, since a large surface temperature difference of the wafer 8 occurs in a heater having a structure which heats an entire bottom region is heated, the surface uniformity of the film forming may be degraded.

The present inventors have conducted research on methods of addressing the above problems and found that, as illustrated in FIG. 4, when the annular-shaped region which is a portion of the bottom region is mainly heated by the cap heater 34 rather than the entire bottom region, there is little temperature difference between the outer circumference of the bottom region and the center portion thereof and the temperature distribution of the bottom region is smooth.

Figure 5:
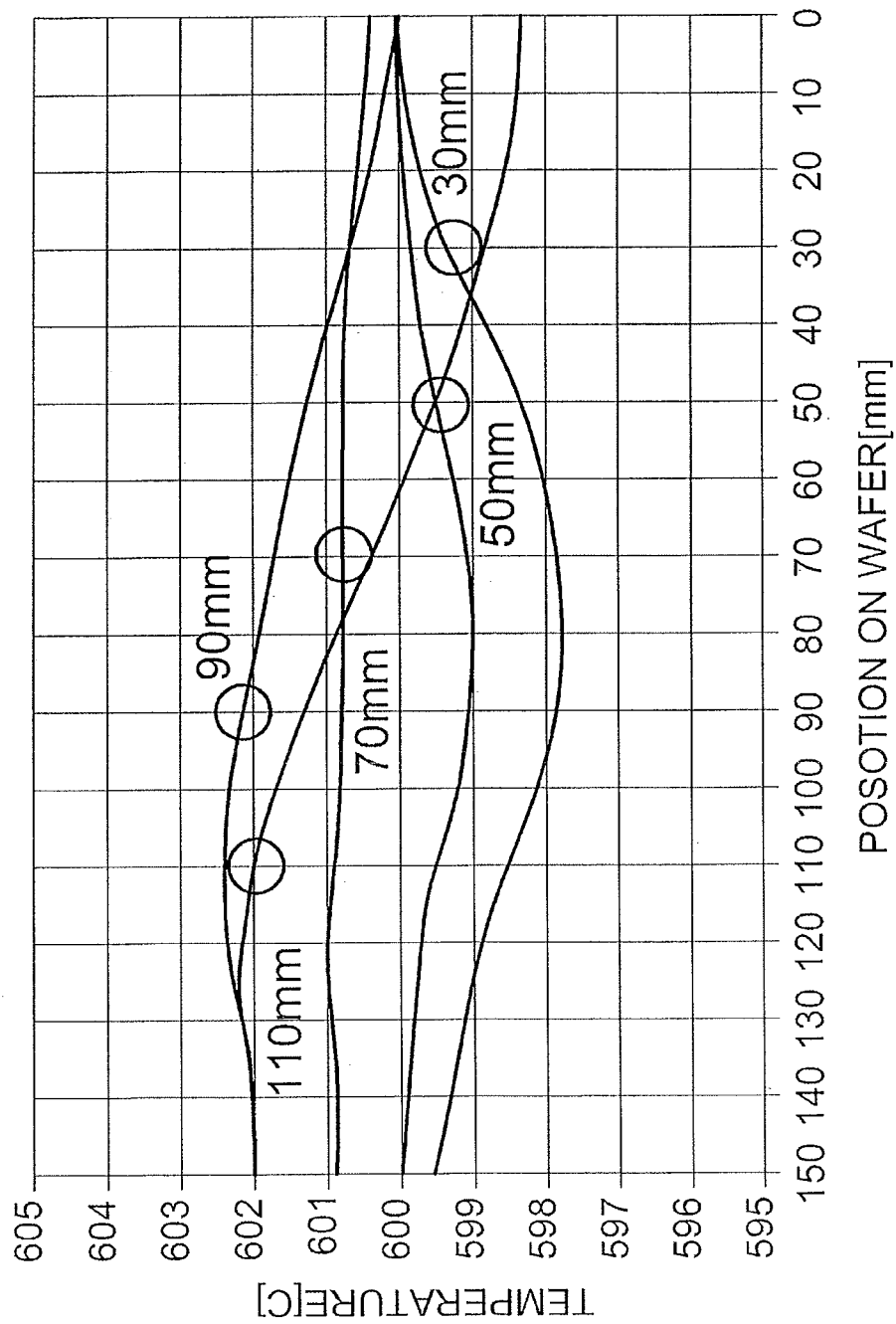
FIG. 5 is a graph illustrating a comparison of surface temperature distributions of a lowermost substrate when a diameter of the cap heater according to the first embodiment of the present invention is changed. Here, each circle represents a position at which the cap heater 34 is installed.
Figure 6:
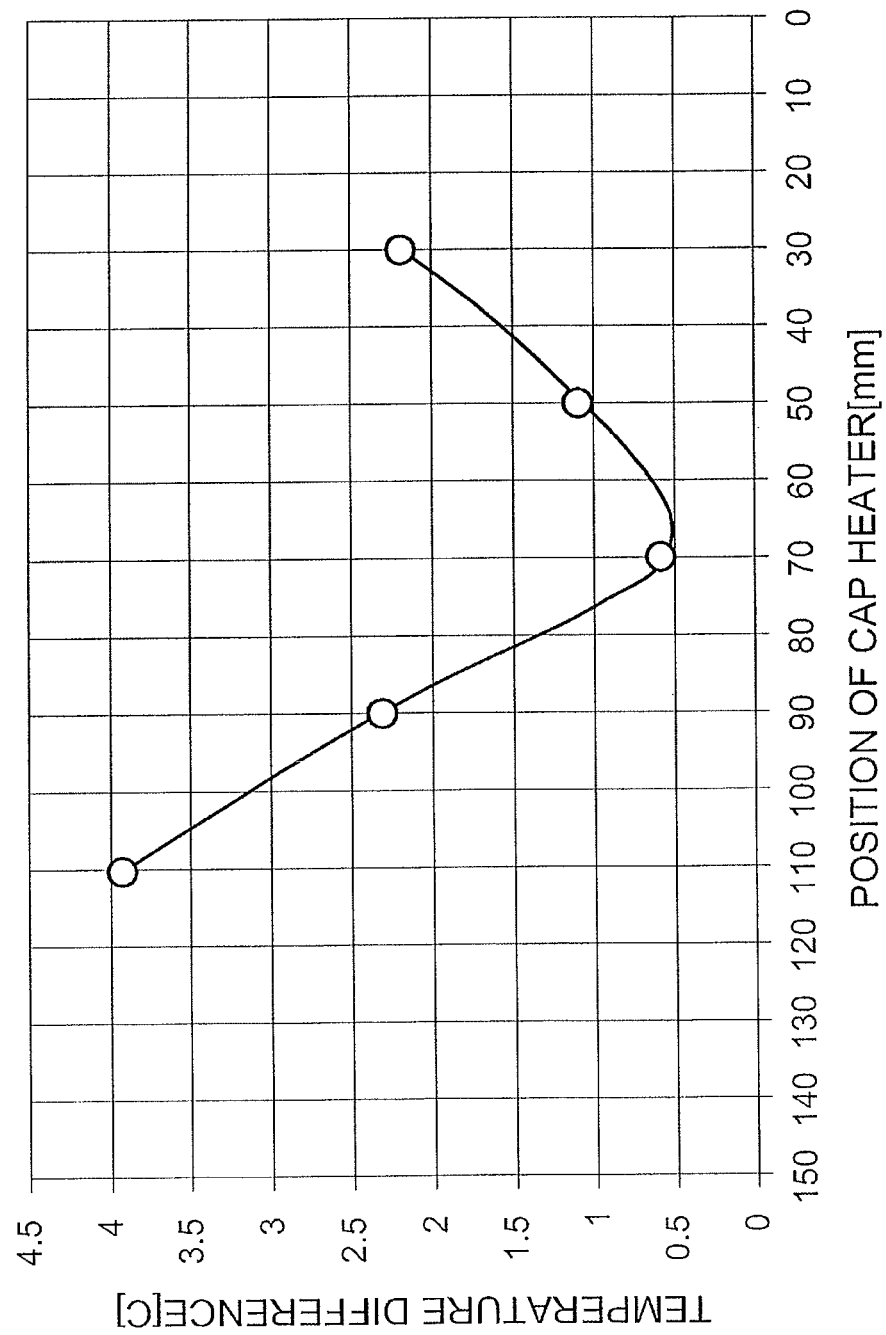
FIG. 6 is a graph illustrating a comparison of maximum differences between surface temperatures of the lowermost substrate when the diameter of the cap heater according to the first embodiment of the present invention is changed.

As illustrated in FIGS. 5 and 6, when a location heated by the cap heater 34 is 90 mm and 110 mm away from the center of the processing chamber 6 in a radial direction [a radius of the cap heater 34], that is, when the outer circumference rather than a middle portion (75 mm) with respect to the radius of the wafer 8a in the bottom region is heated, the surface temperature difference of the wafer 8a was decreased and improved compared to the case of heating the entire bottom region. However, a temperature distribution in which a temperature of the outer circumference of the lowermost wafer 8a is increased and a temperature of the center portion thereof is decreased occurs (see FIG. 5). In addition, since a maximum surface temperature difference of the wafer 8a is still large, the surface temperature is non-uniform (see FIG. 6). It is considered that this is because since there is no heat source at the center portion of the wafer 8a, the center portion of the wafer 8a is difficult to be heated, and the outer circumference of the wafer 8a is doubly heated by the lateral side heater 2 and the cap heater 34.

In addition, when the location heated by the cap heater 34 is 30 mm and 50 mm away from the center of the processing chamber 6 in a radial direction, that is, even when the center portion rather than the middle portion with respect to the radius of the wafer 8a in the bottom region is heated, the surface temperature distribution of the wafer 8a is improved compared to the case of heating the entire bottom region. However, a temperature distribution having a convex shape in which the temperatures of the outer circumference and the center portion are increased in the surface of the lowermost wafer 8a occurs. Even in this case, the maximum surface temperature difference of the wafer 8a is still large, and thus the surface temperature is non-uniform. It is considered that this is because the cap heater 34 is too close to the center portion thereof, and thus the heating to the vicinity of the middle portion of the wafer 8a in a radial direction is lacked.

Meanwhile, when the location heated by the cap heater 34 ranges from 60 mm to 77.5 mm away from the center of the processing chamber 6 in radial direction, that is, the vicinity of the substantially (approximately) middle portion of the lowermost wafer 8a in the radial direction is heated, the temperature difference between the outer circumference of the lowermost wafer 8a and the center portion thereof does not occur and the temperature distribution becomes smooth.

In addition, the surface temperature uniformity was improved with the surface temperature difference of the wafer 8a being about 0.6° C. When the location heated by the cap heater 34 is 77.5 mm in a radial direction away from the center of the processing chamber 6 [the center of the wafer 8a], that is, when the diameter of the cap heater 34 is 155 mm the maximum surface temperature difference of the wafer 8a is minimized and the surface temperature uniformity is improved.

In addition, compared to the case of heating the entire bottom region, when the diameter of the cap heater 34 ranges from 60 mm to 180 mm within the annular-shaped region, the surface temperature distribution was improved. That is, the annular-shaped region concentric with the center of the wafer 8a in the bottom region and having the diameter ranging from 60 mm to 180 mm is mainly heated, it is possible to improve the surface temperature distribution. When the diameter of the cap heater 34 is smaller than 60 mm or greater than 180 mm, the surface temperature difference is about 2.5° C., and the surface temperature distribution the surface uniformity of the film as well as the surface temperature distribution is degraded.

In addition, when the diameter of the cap heater 34 ranges from 90 mm to 160 mm, the surface temperature difference of the wafer 8a may be less than 2° C., and thus additional improvement of the temperature distribution was found. That is, when the inside of the annular-shaped region having a diameter ranging from 90 mm to 160 mm in the bottom region is heated, the temperature distribution can be further improved. In addition, in order to further improve the surface uniformity in the substrate processing, it is preferable that the surface temperature difference of the wafer 8a is within 0.6° C., and the diameter of the cap heater 34 ranges from 120 mm to 155 mm. That is, it is preferable that the diameter of the cap heater 34 ranges from 120 mm to 155 mm such that the inside of the annular-shaped region having a diameter ranging from 120 mm to 155 mm in the bottom region is aggressively heated.

Although an example in which the diameter of the wafer is, for example, 300 mm in the above, the diameter of the wafer is not limited to 300 mm. For example, the same effects as the above example may be obtained even the case of diameters of 150 mm, 200 mm and 450 mm. That is, when a portion of the bottom region between one-fifth and three-fifths with respect to the diameter of the wafer is aggressively heated, the surface temperature distribution is improved. That is, when the diameter of the cap heater 34 is within the annular-shaped region between one-fifth and three-fifths of the diameter of the wafer, the surface temperature distribution is improved. Preferably, when a portion of the bottom region between three-tenths and eight-fifteenths thereof is aggressively heated, the surface temperature distribution can be further improved. That is, when the diameter of the cap heater 34 is within the annular-shaped region between three-tenths and eight-fifteenths of the diameter of the wafer, the surface temperature distribution can be further improved. More preferably, when a portion of the bottom region between two-fifths and thirty-one-sixtieths thereof is aggressively heated, the surface temperature distribution can be further improved, and thus the uniformity of the substrate processing can be improved. That is, when the diameter of the cap heater 34 is within the annular-shaped region between two-fifths and thirty-one-sixtieths of the diameter of the wafer, the surface temperature distribution can be further improved, and thus the surface uniformity of the substrate processing can be improved.

As described above, in a process in which the location heated by the cap heater 34 in a radial direction is moved from the outer circumference of the bottom region to the center portion thereof, that is, between a temperature distribution in which the surface temperature of the lowermost wafer 8a is high in the outer circumference thereof and is low in the center portion thereof and a temperature distribution having a convex shape in which the surface temperature of the lowermost wafer 8a is high in the outer circumference and the center portion thereof and is low therebetween, the surface temperature of the lowermost wafer 8a has a temperature distribution in which a temperature difference between the outer circumference and the center portion is very little.

Although differences according to devices or the like may exist, when the heated location with respect to the radial is changed from the outer circumference to the center portion, there is a location in which the surface temperature distribution of the lowermost wafer 8a becomes uniform. Therefore, the uniformity of substrate processing may be improved by obtaining the heated location where the surface temperature distribution of the lowermost wafer 8a is uniform through experiments and then obtaining a diameter of the cap heater 34 which enables the heating of the desired location.

Figure 7:
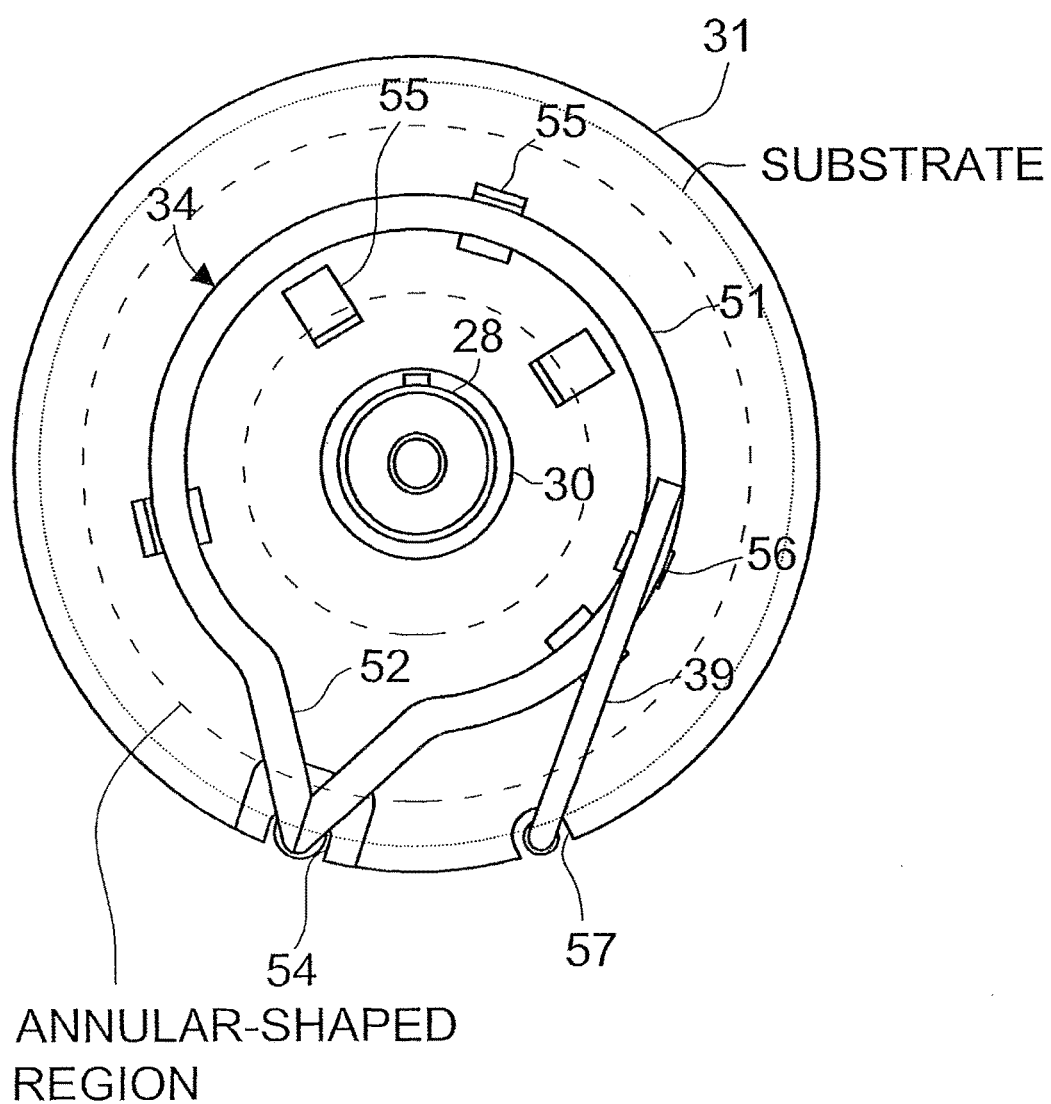
FIG. 7 is a top view illustrating the cap heater and peripheries thereof according to the first embodiment of the present invention.
Figure 8:
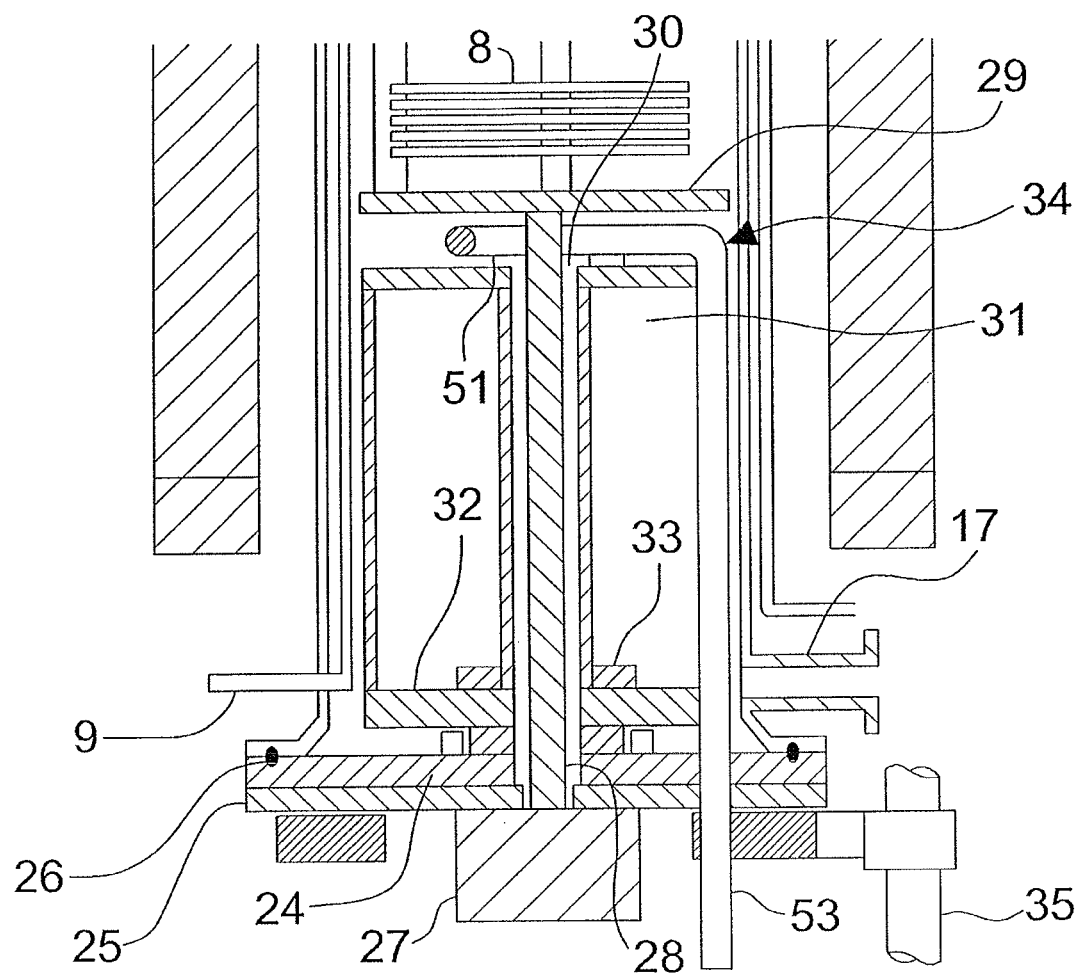
FIG. 8 is an enlarged side sectional view illustrating the bottom region of the substrate processing apparatus according to the first embodiment of the present invention.
Figure 9:
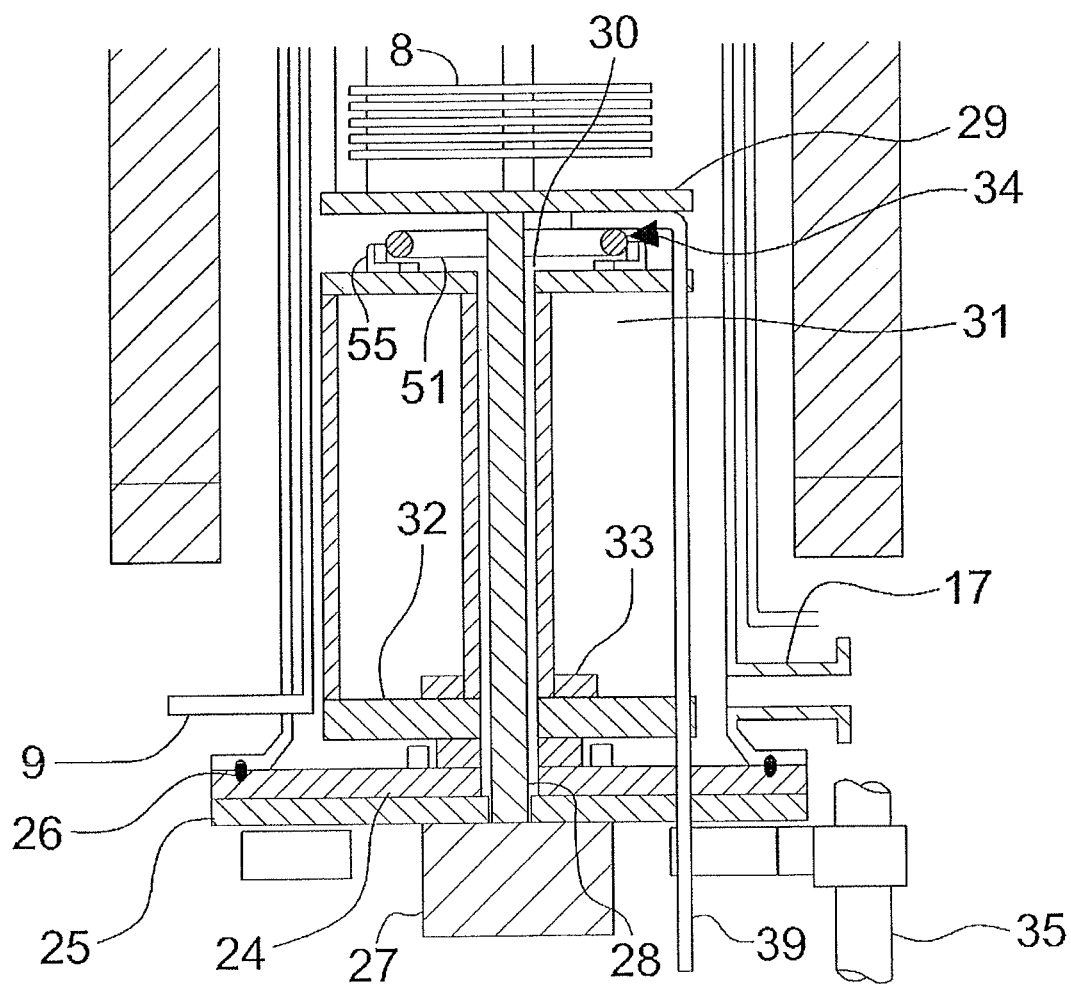
FIG. 9 is an enlarged side sectional view illustrating the bottom region of the substrate processing apparatus according to the first embodiment of the present invention.

Next, an example of the cap heater 34 of the first embodiment will be described with reference to FIGS. 7 through 13. As illustrated in FIG. 7, the cap heater 34 includes the heater 51 having an substantially (approximately) annular shape installed on an upper end thereof and a V-shaped reinforcing member 52 which protrudes from both ends of the heater 51 toward an outer circumferential direction. Here, the heater 51 has a ring shape of which a portion is open, in other words, has a circular arc shape (a horseshoe shape). In addition, as illustrated in FIG. 8, the cap heater 34 includes a suspending member 53, which is bent at a base portion (an end of the outer circumference) of the reinforcing member 52 and vertically extends downward.

A first notched portion 54 extending over an entire length thereof in a vertical direction is formed on a peripheral surface of the thermal insulation unit 31. The suspending member 53 is inserted into and passes through the first notched portion 54, and thus the first notched portion 54 is configured to prevent or substantially prevent the suspending member 53 from protruding from the peripheral surface of the thermal insulation unit 31. In addition, the suspending member 53 air-tightly passes through the base 24 and the seal cap 25, is connected to a power supply unit (not illustrated), and a through portion of the suspending member 53 is sealed by a predetermined sealing member such as a joint for vacuum and the like.

In addition, a location at which the first notched portion 54 is formed, that is, a location at which the reinforcing member 52 is formed is on an upper side of the exhaust unit 17, and the reinforcing member 52 and the exhaust unit 17 are matched or substantially (approximately) matched in a plane direction.

On an upper surface of the thermal insulation unit 31, a plurality of spacers 55 are installed at a predetermined angular pitch between the heater 51 and the thermal insulation unit 31, and a gap is formed between the spacer 55 and the heater 51. The spacer 55 is formed of a thermal insulation member such as quartz, and is configured to prevent the heater 51 from being directly in contact with the thermal insulation unit 31 when the cap heater 34 is deformed due to aged deterioration.

In addition, the second temperature sensor 39 such as a thermocouple and the like is installed such that a front end thereof is in contact with an upper surface of the heater 51. A position of the front end of the second temperature sensor 39 is fixed by a supporting unit 56 which is a temperature measuring member support installed in the heater 51. The supporting unit 56 is installed at a location, which is further displaced from a position displaced from the base portion of the reinforcing member 52 by an angle of 90° to a predetermine angle, for example an angle of 5°, such that the contact length (contact area) of the heater 51 and the second temperature sensor 39 is increased. In addition, the second temperature sensor 39 and the heater 51 have a relationship in which a center line of the second temperature sensor 39 is a tangent line or a substantially (approximately) tangent line with respect to a virtual circle (central circle) formed by a center line of the heater 51 in a plan view.

A base end side of the second temperature sensor 39 extends toward a peripheral edge portion of the thermal insulation unit 31, and is bent vertically downward at the peripheral edge portion of the thermal insulation unit 31. A bent portion of the second temperature sensor 39 is inserted into and passes through a second notched portion 57 formed over an entire length in a vertical direction on the peripheral surface of the thermal insulation unit 31, air-tightly passes through the base 24 and the seal cap 25 through the predetermined sealing member such as joint for vacuum and the like, and is electrically connected to the temperature control unit 38.

When the second temperature sensor 39 is also inserted into and passes through the second notched portion 57 in the same manner as the suspending member 53 of the cap heater 34, the second temperature sensor 39 is configured not to protrude from the peripheral surface of the thermal insulation unit 31.

Figure 10:
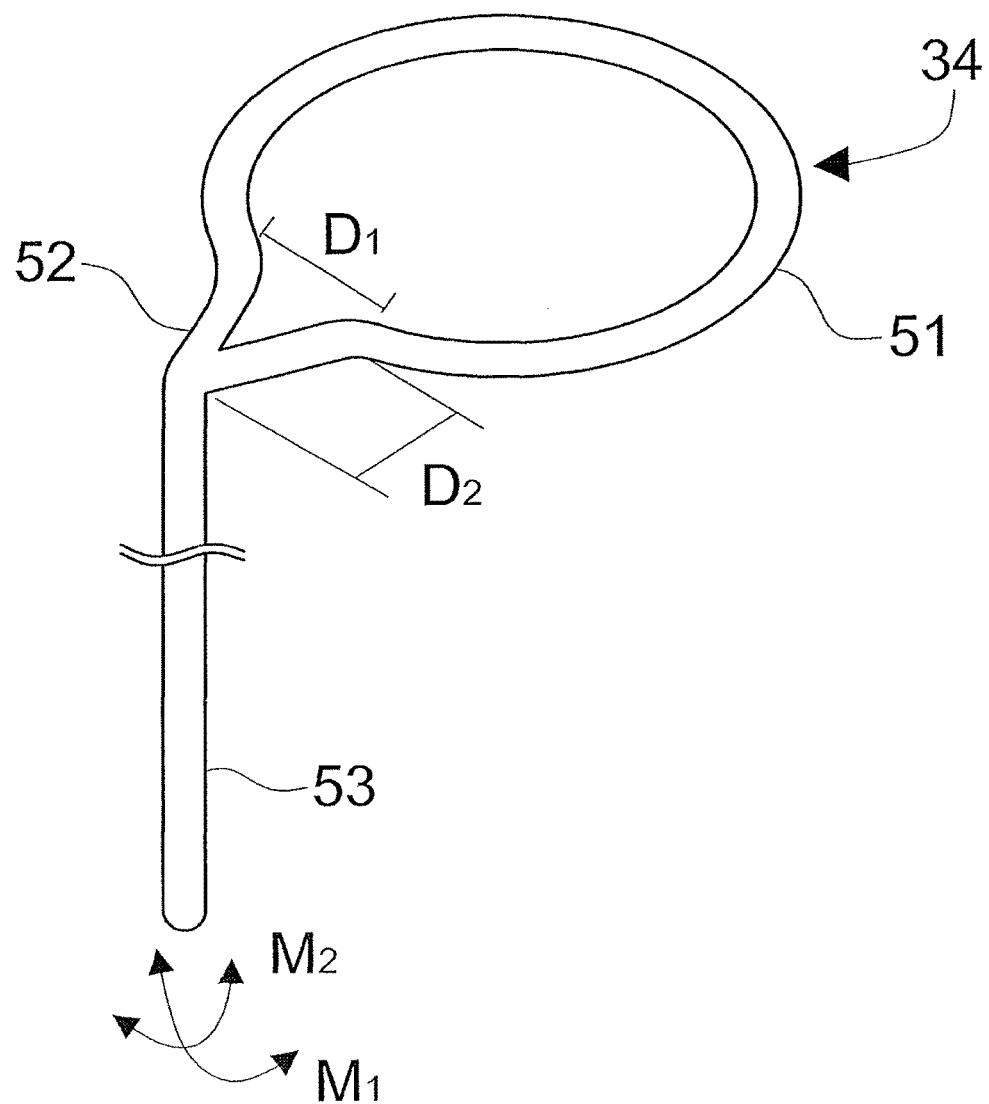
FIG. 10 is a perspective view illustrating the cap heater according to the first embodiment of the present invention.
Figure 11:
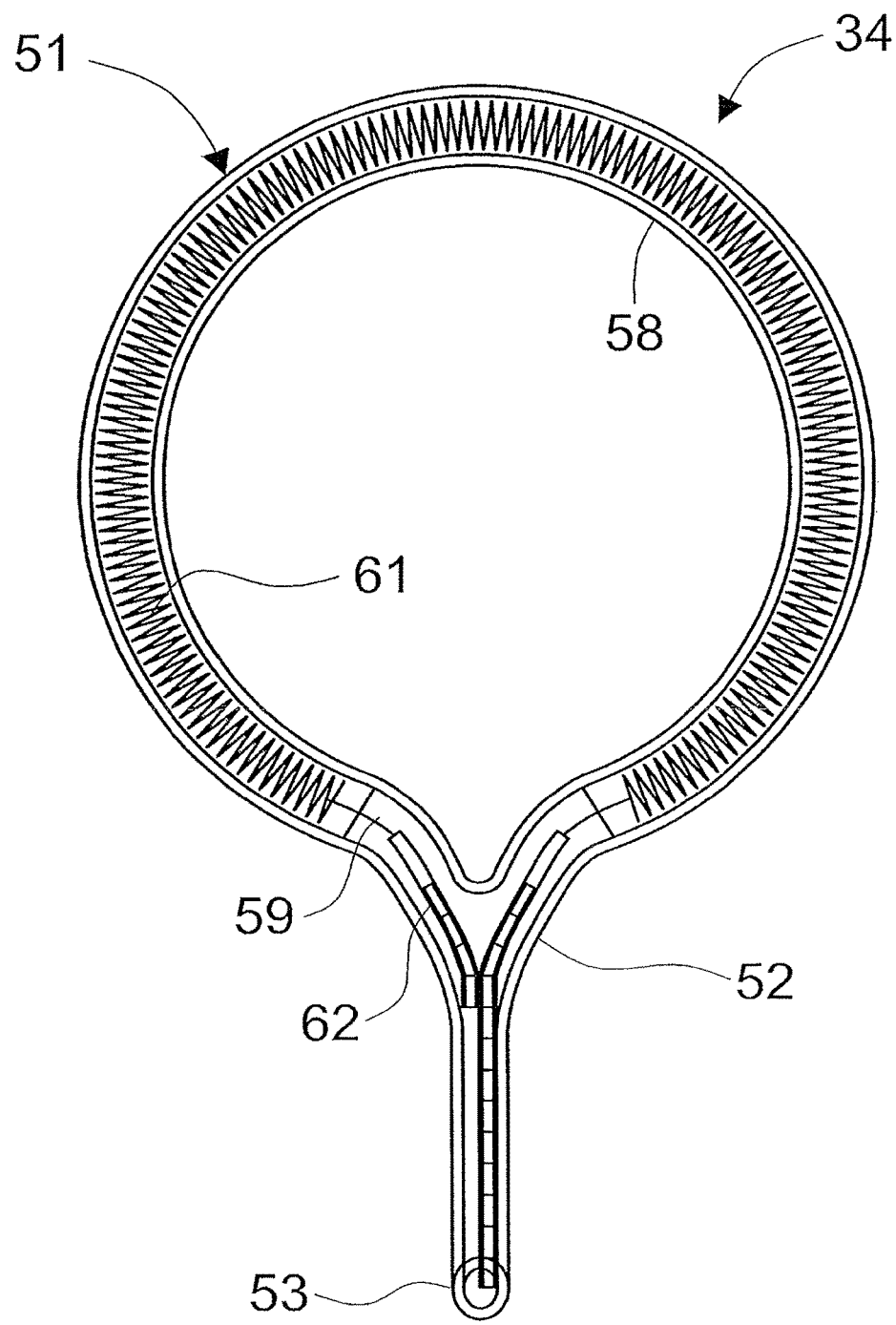
FIG. 11 is a top view illustrating the cap heater according to the first embodiment of the present invention.
Figure 12:
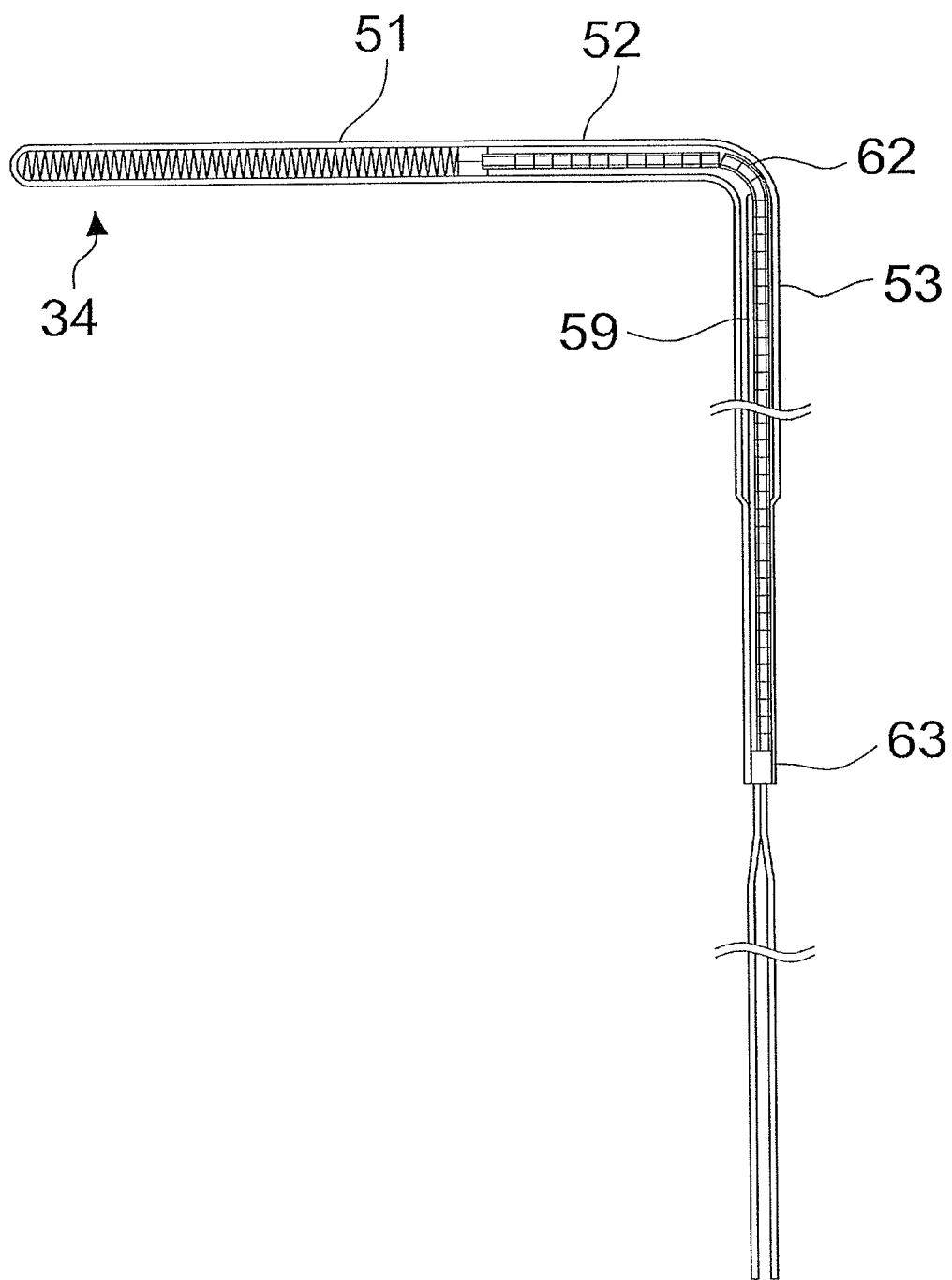
FIG. 12 is a lateral sectional view illustrating the cap heater according to the first embodiment of the present invention.
Figure 13:
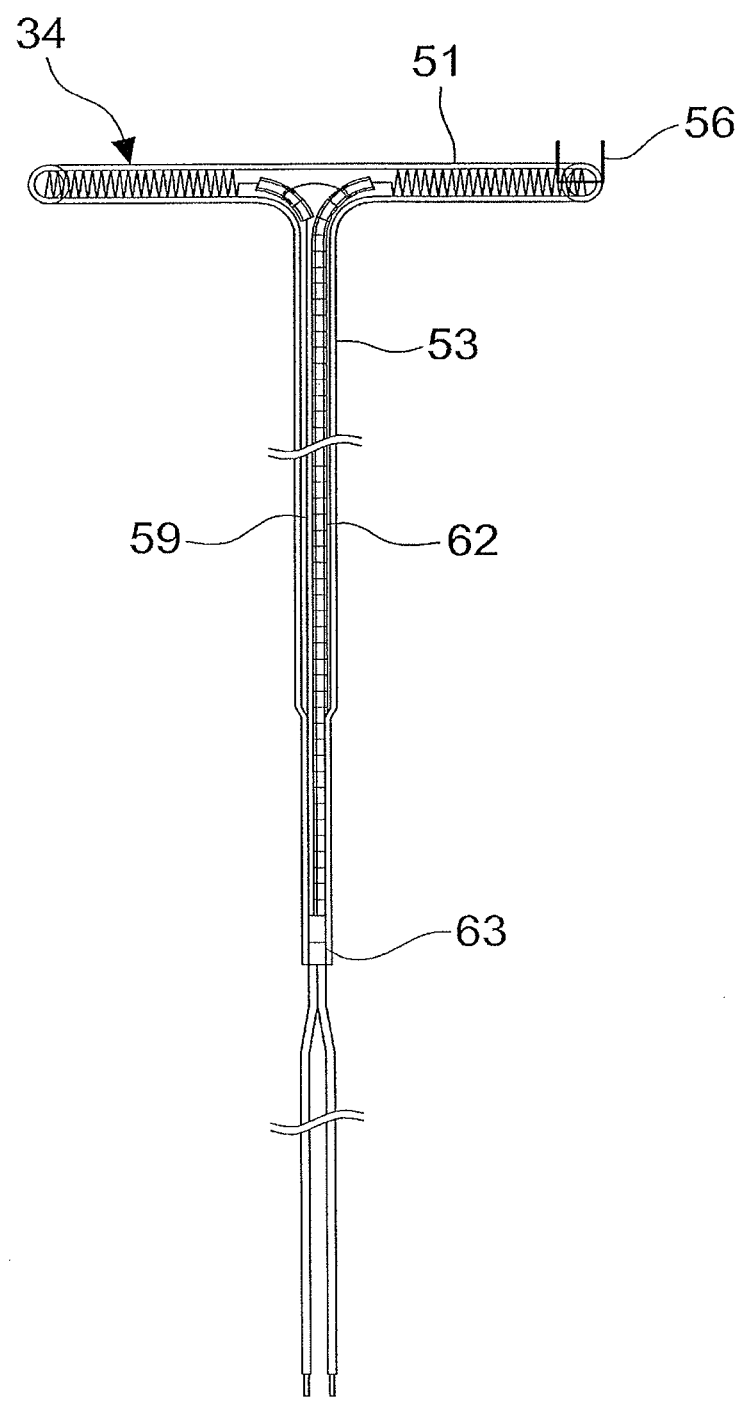
FIG. 13 is a front view illustrating the cap heater according to the first embodiment of the present invention.

Next, the cap heater 34 will be described in detail with reference to FIGS. 10 through 13. A vertical angle of the V-shaped reinforcing member 52 is, for example, 60°. In addition, as illustrated in FIG. 10, when a distance between boundaries of the heater 51 and the reinforcing member 52 is D1 [a length of a V-shaped base], the force applied to the boundaries between the heater 51 and the reinforcing member 52 is reduced by the opposite force caused by the distance D1 for a tangential moment M1 with respect to the peripheral surface of the thermal insulation unit 31. In addition, when a protruding distance to the heater 51 of the reinforcing member 52 [a distance from a central circle of the heater 51 to a V-shaped apex] is D2, the force applied to the boundaries between the heater 51 and the reinforcing member 52 is reduced by opposite force caused by the distance D2 for a moment M2 (a moment in a radius direction) in a direction separated from the thermal insulation unit 31.

The cap heater 34 includes a protective member 58 made of quartz, which is a frame having a cross-sectional circular shape and conductive wires 59 inserted into the protective member 58, and the conductive wires 59 may include a set of wires made of nickel. The conductive wires 59 constitutes a heating element, a resistive heating element 61 having a coil shape for example, in the heater 51 with the boundary between the heater 51 and the reinforcing member 52 as a heating point. The cap heater 34 is heated by supplying power to the resistive heating element 61.

The conductive wires 59 which are inserted into and pass through the heater 51 are merged into the reinforcing member 52, and are suspended in the suspending member 53 while being restrained. In addition, a protection glass 62 which is an insulating member in the reinforcing member 52 is mounted on the conductive wires 59, and the conductive wires 59 are insulated from each other by the protection glass 62.

The protection glass 62 is made of, for example, a plurality of pieces of connected ceramic glass having a cylindrical shape. When the conductive wires 59 are inserted into and pass through the ceramic glass and an interval between the pieces of connected ceramic glass is decreased, the insulation between the restrained conductive wires 59 is ensured.

In addition, in the suspending member 53, only one of the restrained conductive wires 59 is inserted into and passes through the protection glass 62. In addition, when a sufficient diameter of the suspending member 53 is ensured, both ends of the restrained conductive wires 59 may be inserted into and pass through the protection glass 62.

A lower end of the suspending member 53 is air-tightly sealed or is sealed in an electrically insulated state by a cap 63 formed by an insulating member such as silicone. That is, the resistive heating element 61 is air-tightly encapsulated in the protective member 58 in the electrically insulated state. In addition, the conductive wire 59 extends from the lower end of the suspending member 53 in a state of being covered with the insulating member such as Teflon (registered trademark), and is connected to the power supply unit (not illustrated).

As described above, in the present embodiment, one or a plurality of effects to be described will be obtained.

(a) Since the diameter of the heater of the cap heater is formed in a circular arc shape (horseshoe shape) smaller than that of the wafer and the protective member of the cap heater is made of quartz having a small plate thickness, increasing and decreasing of the temperature of the cap heater is facilitated, and thus a recovery time can be reduced and throughput can be improved.

(b) Since the diameter of the cap heater is smaller than the diameter of the wafer, the flow of the gas from the gas inlet hole toward the gas exhaust unit is not interfered, the gas is uniformly supplied onto the surface of the wafer, and thus the surface uniformity of the wafer can be improved.

(c) Since the annular-shaped region in the center portion of the wafer rather than the peripheral edge portion of the lowermost wafer is aggressively heated by the cap heater, the peripheral edge portion of the lowermost wafer is prevented from being doubly heated by the lateral side heater and the cap heater, the bottom region of which the temperature is easily lowered may be efficiently and uniformly heated, and thus the surface temperature uniformity of the wafer can be improved.

(d) Since the cap heater includes the V-shaped reinforcing member protruding from the heater to the outer circumference thereof and the suspending member is bent downward from the base of the reinforcing member to be formed, it is possible to ensure the strength of the cap heater without the installation of the additional reinforcing member, and thus the number of components can be reduced.

(e) Since the reinforcing member is located over the gas exhaust unit, even when a turbulent flow occurs in the gas by the V-shaped reinforcing member, it is possible to quickly exhaust the turbulent flow and the turbulent flow is prevented from occurring, the gas is uniformly supplied onto the wafer, and thus the surface uniformity can be improved.

(f) Since the suspending member is inserted into and passes through the first notched portion formed over an entire length of the thermal insulation unit in a vertical direction and the suspending member is formed so as not to protrude from the peripheral surface of the thermal insulation unit, the flow of the gas may be prevented from being interfered by the suspending member.

(g) Since only one of the restrained wires is inserted into and passes through the protection glass in the suspending member, an inner diameter of the suspending member is decreased and space saving of the cap heater can be achieved.

(h) Since the cap heater is installed to be fixed and the boat is formed to be independently rotated with respect to the cap heater, the heating imbalance of the wafer when using the cap heater is suppressed, and thus the wafer can be uniformly heated.

(i) Since a spacer is installed on the upper surface of the thermal insulation unit, the cap heater is not directly in contact with the thermal insulation unit when the cap heater is deformed by heat and is suspended, the heat is not taken by the thermal insulation unit, and thus the durability of the cap heater can be improved.

(j) Since the second temperature sensor is installed to be in contact with the upper surface of the heater of the cap heater and the temperature of the cap heater may be measured at the wafer side which is a heated body, the measurement accuracy of the temperature of the cap heater is improved, the heating controllability is improved, and thus the surface uniformity of the wafer can be improved.

(k) Since the second temperature sensor is fixed by the supporting unit installed at a position further displaced from a position displaced from the base portion of the reinforcing member by an angle of 90° to a predetermine angle, the contact area between the second temperature sensor and the heater is increased, a quartz tube for protecting the thermocouple is heated in a short period of time, a measurement error can be reduced, and thus the second temperature sensor can be easily located.

(l) When the location heated by the cap heater is at the middle of a radius of the wafer or the vicinity of the middle thereof, the temperature difference between the outer circumference and the center portion in the bottom region in the processing chamber is decreased, the bottom region is efficiently and uniformly heated, and thus the surface uniformity of the temperature of the wafer can be further improved.

(m) Since a crack length may extend to the lower portion of the processing chamber by heating a portion of which the temperature of the lower portion in the processing chamber is easily decreased by the cap heater, the number of dummy wafers can be reduced. That is, it is possible to increase the processing number of product wafers, and thus the productivity can be improved.

Figure 14:
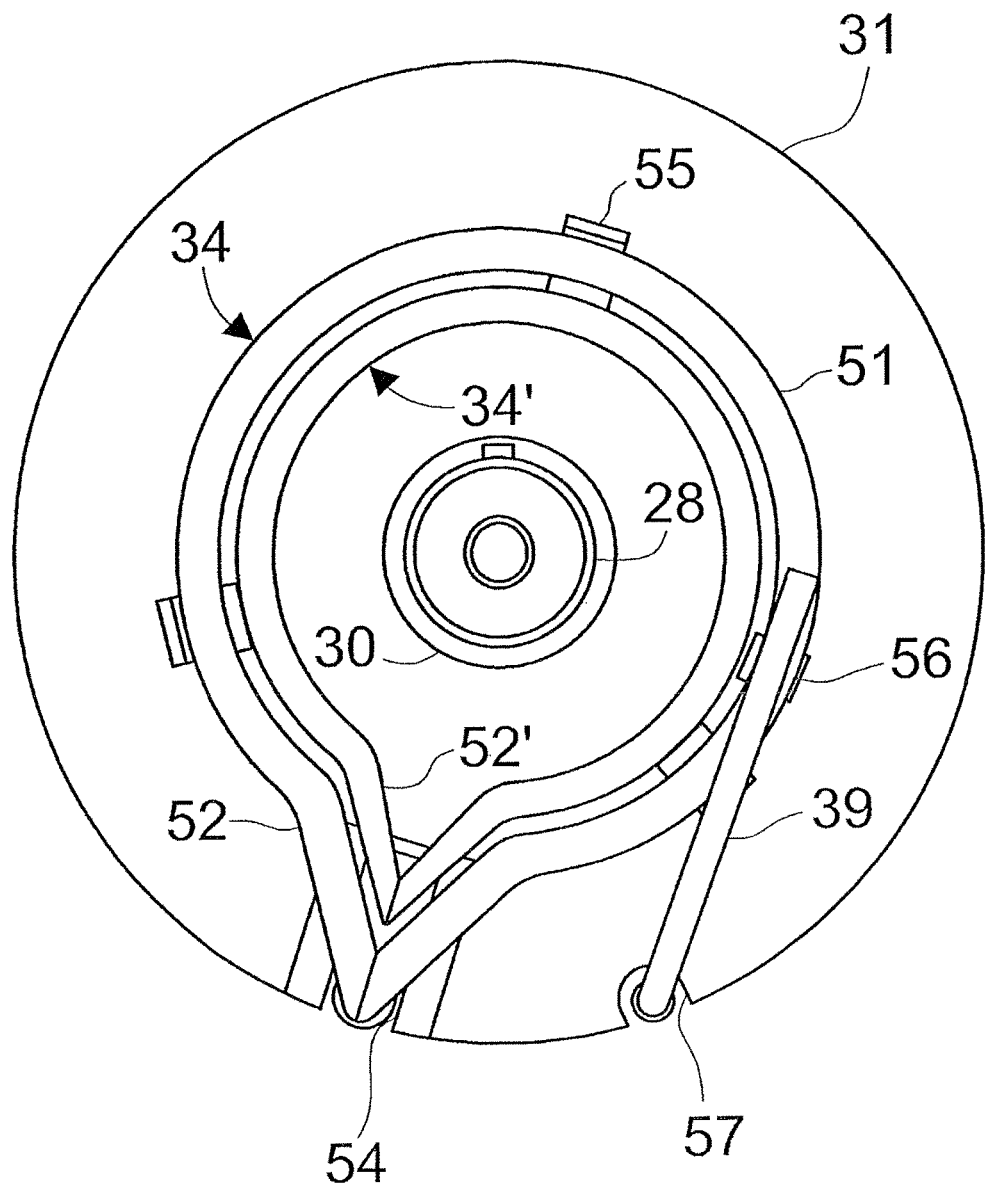
FIG. 14 is a top view illustrating a cap heater and peripheries thereof according to a modification of the first embodiment of the present invention.

FIG. 14 illustrates a modification of the first embodiment. In the modification, a cap heater 34' having a smaller diameter than that of the cap heater 34 is concentrically installed with respect to the cap heater 34. In addition, since a structure of the cap heater 34' is the same as the cap heater 34, description thereof is omitted.

In the modification, as a notch depth of the first notched portion 54 is increased and the suspending member 53 (see FIG. 8) of the cap heater 34 and a suspending member (not illustrated) of the cap heater 34' are inserted into and pass through the first notched portion 54, the suspending member may be installed so as not to protrude from the peripheral surface of the thermal insulation unit 31.

When the plurality of cap heaters 34 and 34' are installed in the annular-shaped region and it is possible to individually control each of the cap heaters 34 and 34', the heating controllability by the cap heaters 34 and 34' may be further improved, the bottom region may be further effectively heated, and thus the surface temperature uniformity of the wafer 8 can be further improved. In addition, although one second temperature sensor 39 is installed in FIG. 14, it is possible to more precisely control the temperature by installing the second temperature sensor 39 in each of the cap heaters 34 and 34', and thus the heating controllability can be further improved.

Figure 15:
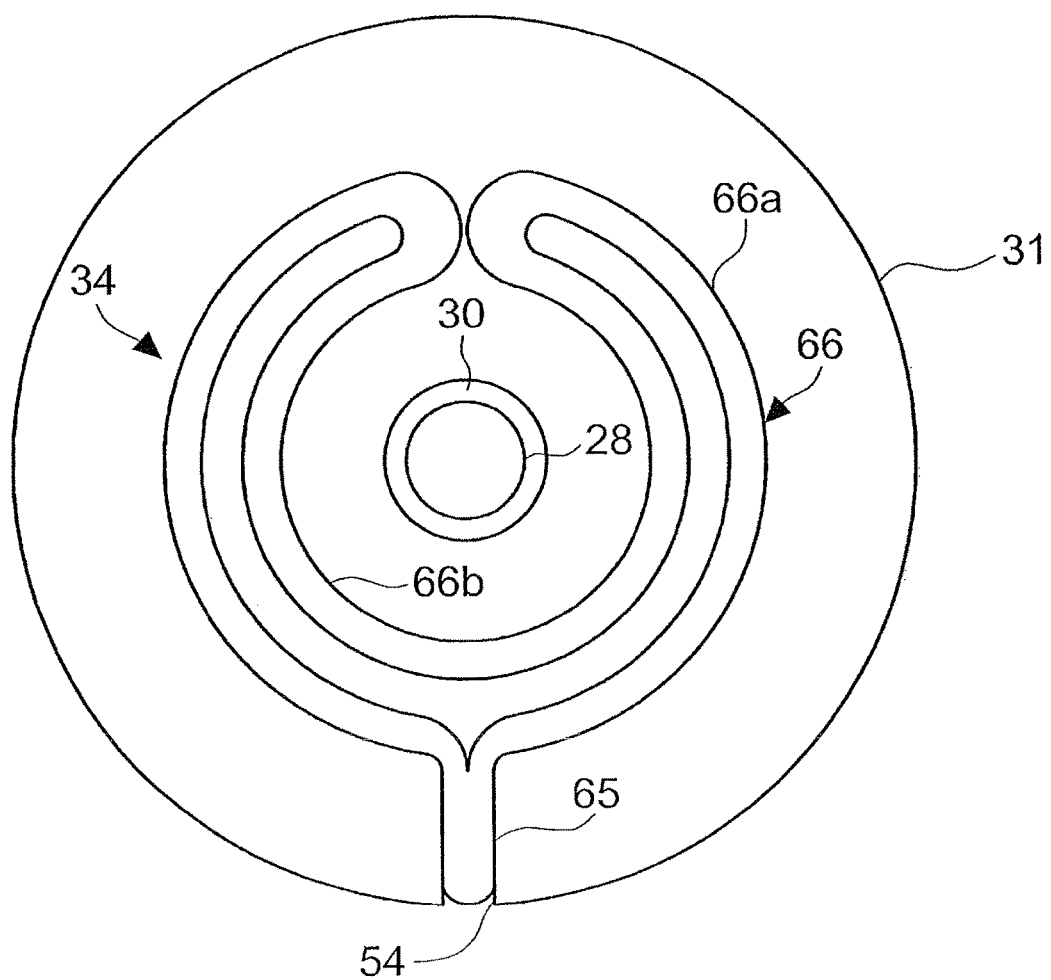
FIG. 15 is a top view illustrating a cap heater and peripheries thereof according to a second embodiment of the present invention.

Next, a second embodiment of the present invention will be described with reference to FIG. 15. In addition, in FIG. 15, the same components as those in FIG. 7 are denoted by the same numerals, and description thereof is omitted.

In the second embodiment, the cap heater 34 includes a heater 66 having a double structure in which an outer circle portion 66a and an inner circle portion 66b, which are concentrically installed in a multiple manner with respect to each other. In addition, the cap heater 34 includes the suspending member 53 (see FIG. 8) which is inserted into and passes through the first notched portion 54 and an extending portion 65 which is bent along an upper surface of the thermal insulation unit 31 and extends from the suspending member 53 toward a center of the thermal insulation unit 31.

The outer circle portion 66a is fixed to the extending portion 65 on the base end side by welding or the like. In addition, the outer circle portion 66a and the inner circle portion 66b are fixed at a position substantially (approximately) facing the extending portion 65, that is, at a front end side by welding or the like. In addition, at the front end side, the outer circle portion 66a is not connected to each other, the inner circle portion 66b is not connected to each other, and the front end of the heater 66 is formed in a state to be separated. That is, the heater 66 is configured to have a double structure in which the outer circle portion 66a and the inner circle portion 66b are integrated into a set. In addition, although not illustrated, similar to the first embodiment, the resistive heating element having a coil shape is encapsulated in the heater 66 with the boundary between the extending portion 65 and the outer circle portion 66a as a heating point.

In the second embodiment, the heater 66 is configured to have a double structure. Therefore, it is possible to increase the output of the cap heater 34, and thus the bottom region under the processing chamber 6 (see FIG. 1) may be effectively heated. In addition, since the cap heater 34 may be configured to have a set of the conductive wires 59 (see FIG. 11), one power supply unit may correspond to the cap heater 34 including the heater 66 having the double structure, and thus a control system can be simplified and the number of components can be reduced.

Figure 16:
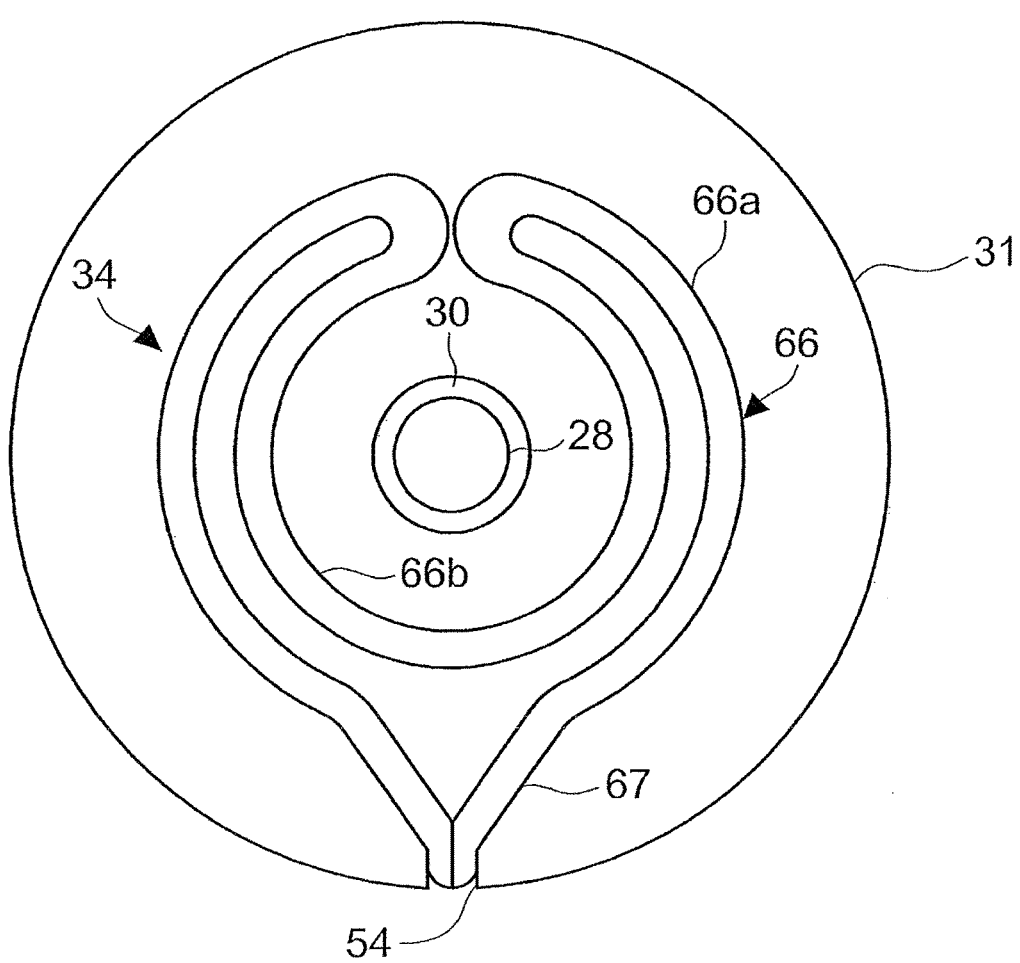
FIG. 16 is a top view illustrating a cap heater and peripheries thereof according to a modification of the second embodiment of the present invention.

FIG. 16 illustrates a modification of the second embodiment of the present invention. In the modification of the second embodiment, the cap heater 34 includes a reinforcing member 67 having the same shape as the V-shaped reinforcing member 52 (see FIG. 7) in the first embodiment instead of the extending portion 65 in the second embodiment.

When a suspending member (not illustrated) is forming by being bent downward at a base portion of the reinforcing member 67, strength of the thermal insulation unit 31 of the cap heater 34 in a direction along the peripheral surface and in a direction separated from the thermal insulation unit 31 can be improved.

Figure 17:
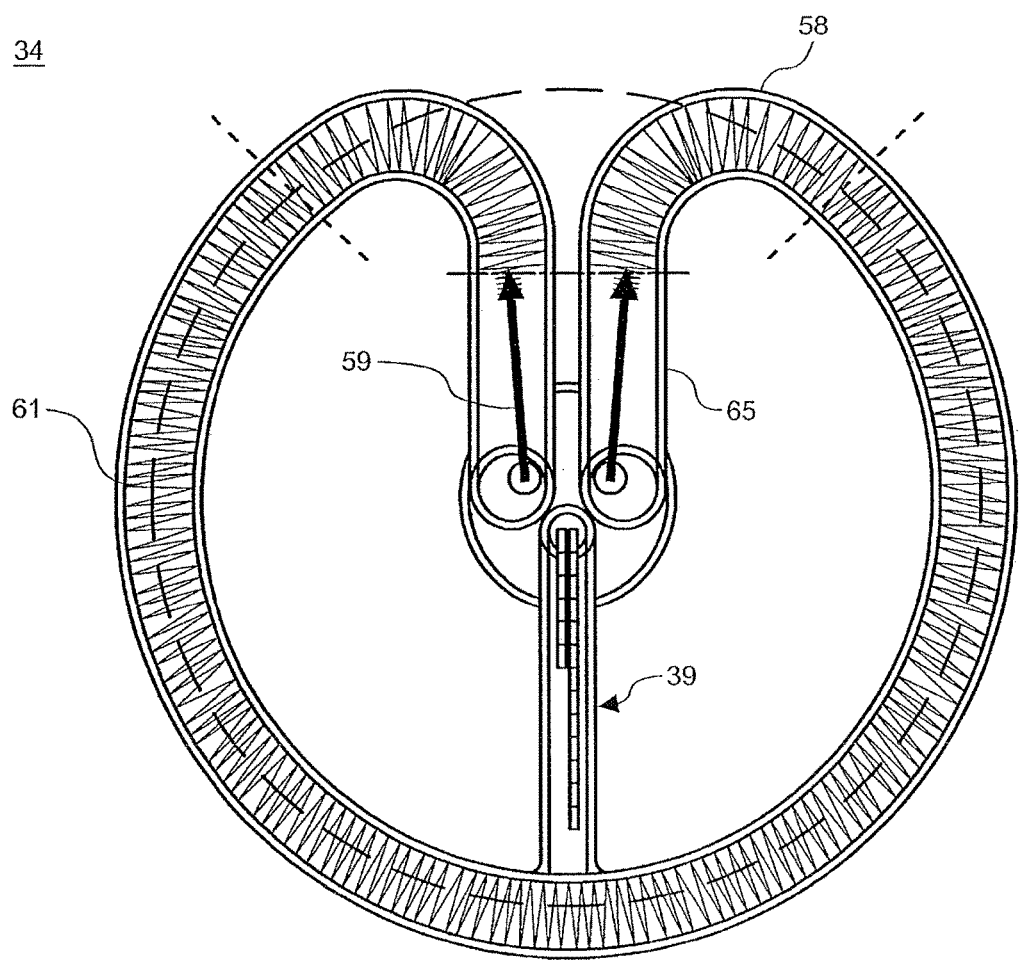
FIG. 17 is a top view illustrating a cap heater according to a third embodiment of the present invention.
Figure 18:
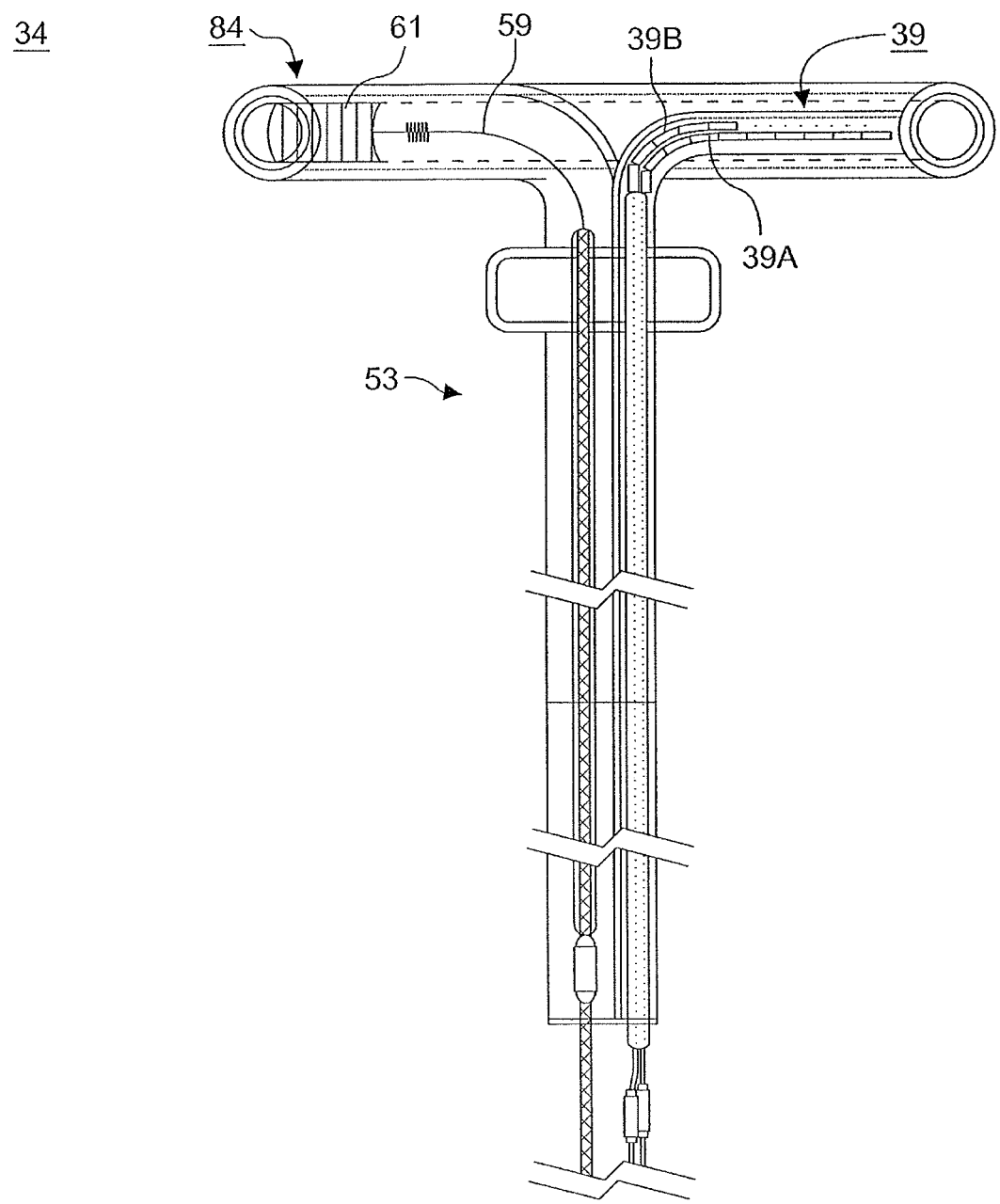
FIG. 18 is a longitudinal sectional view illustrating the cap heater according to the third embodiment of the present invention.

Next, a third embodiment of the present invention will be described with reference to FIGS. 17 and 18. In addition, the same components as those in FIG. 7 are denoted by the same numerals, and description thereof is omitted.

In the third embodiment, a suspending member 53 is formed at the center of the heater 51 in a plan view. In addition, the cap heater 34 includes an extending portion 65 which is bent on an upper portion of the suspending member 53 in a horizontal direction and extends from the center of the thermal insulation unit 31 toward the outside thereof. The extending portion 65 is formed in a pair of I-shaped shape to be connected to both ends of the heater 51, and converges into one on an upper end of the suspending member 53. The second temperature sensor 39 is horizontally bent from the center of the heater 51 along an upper surface of the thermal insulation unit 31 in a direction opposite to the extending portion 65, and is formed to be connected to a side surface of the heater 51. As illustrated in FIG. 17, since a pair of the extending portion 65 and the second temperature sensor 39 converges into one, a diameter of the upper end of the suspending member 53 is greater than that of a lower portion of the suspending member 53. The second temperature sensor 39 includes a first sensor 39A which detects a temperature of the heater 51 and a second sensor 39B which detects a temperature of the vicinity of the center of the bottom region.

The heater 51 is formed in a substantially (approximately) cardioid shape (a heart shape). In other words, the heater 51 is formed in a shape obtained by separating a cusp of the cardioid shape. Similar to the first embodiment, the resistive heating element having a coil shape is encapsulated in the heater 51 with the boundary between the extending portion 65 and the heater 51 as a heating point. Preferably, a curved portion of the cardioid shape is formed in a circular shape. The suspending member 53 is installed to pass through the hole 30, the seal cap 25 and the base 24.

Since the resistive heating element is encapsulated to the cusp of the cardioid shape, an area of a portion in the annular-shaped region heated by the heater 51 can be increased, and thus the heating performance by the cap heater 34 can be improved. According to this configuration, the bottom region can be further effectively heated, and thus the surface temperature uniformity of the wafer 8 can be further improved. In addition, since the heater 51 is supported by the suspending member 53 installed at a center position of the heater 51 in a plan view, sagging or distortion of the heater 51 may not easily occur by aged deterioration. Since the cap heater 34 may operate in a long term, the productivity can be improved.

In addition, in the first embodiment, the second embodiment and the third embodiment, the resistive heating element having a coil shape is exemplified as the heating element. However, it is needless to say that it is possible to use a lamp heater such as a halogen lamp serving as a heating element.

The present invention is not limited to the formation of the above-described oxide film, and the present invention may be preferably applied to the formation of a nitride film. For example, as the above-described exemplified source gas and $NH_3$ gas serving as a reaction gas are used, the nitride film may be formed.

In addition, the present invention may be preferably applied to the formation of a metal-based thin film containing a metal element such as titanium (Ti), zirconium (Zr), hafnium (Hf), tantalum (Ta), niobium (Nb), aluminum (Al), molybdenum (Mo) and tungsten (W).

According to the present invention, a time for stabilizing a temperature in a processing chamber can be reduced.

Preferred Embodiments of the Present Invention

Hereinafter, preferred embodiments according to the present invention are supplementarily noted.

<Supplementary Note 1>

According to an aspect of the present invention, there is provided a substrate processing apparatus including:

a substrate support configured to support a substrate;

a thermal insulation unit disposed below the substrate support;

a reaction tube including a processing chamber where the substrate is processed;

a first heating unit disposed around the reaction tube; and a second heating unit disposed between the substrate support and the thermal insulation unit, the second heating unit including a heater having a substantially annular shape and a suspending member extending downward from the heater, wherein a diameter of the heater is smaller than that of the substrate.

<Supplementary Note 2>

In the substrate processing apparatus of Supplementary note 1, preferably, the diameter of the heater ranges from one-fifth to three-fifth of that of the substrate.

<Supplementary Note 3>

In the substrate processing apparatus of any one of Supplementary notes 1 and 2, preferably, further includes a temperature measuring member being in contact with a surface of the heater.

<Supplementary Note 4>

In the substrate processing apparatus of any one of Supplementary notes 1 through 3, preferably, the first heating unit includes: an upper heater configured to heat an upper region of the processing chamber where the substrate support is accommodated; and a lower heater configured to heat an lower region of the processing chamber where the thermal insulation unit is accommodated, and the heater is installed equal to or higher than a boundary between the upper heater and the lower heater.

<Supplementary Note 5>

In the substrate processing apparatus of Supplementary note 4, preferably, a temperature of the heater is equal to or lower than that of the lower heater.

<Supplementary Note 6>

In the substrate processing apparatus of any one of Supplementary notes 1 through 3, preferably, the heater has arc shape (horseshoe shape).

<Supplementary Note 7>

In the substrate processing apparatus of Supplementary note 4, preferably, the second heating unit further includes a V-shaped reinforcing member extruding from the heater toward an outer circumference thereof.

<Supplementary Note 8>

In the substrate processing apparatus of Supplementary note 3, preferably, the second heating unit further includes a temperature measuring member support installed at the heater, the temperature measuring member support configured to fix the temperature measuring member to the surface of the heater.

<Supplementary Note 9>

In the substrate processing apparatus of Supplementary note 8, preferably, the temperature measuring member support is installed at a position at which a center line of the temperature measuring member is a tangent line or a substantially (approximately) tangent line with respect to a virtual circle formed by a center line of the heater.

<Supplementary Note 10>

In the substrate processing apparatus of Supplementary note 7, preferably, a base portion of the reinforcing member is connected to the suspending member, and an insulating member is mounted on only one of a pair of heating elements in the suspending member.

<Supplementary Note 11>

In the substrate processing apparatus of Supplementary note 8, preferably, further including a spacer installed on an upper surface of the thermal insulation unit below the heater with a gap between the spacer and the heater.

<Supplementary Note 12>

In the substrate processing apparatus of Supplementary note 11, preferably, the V-shaped reinforcing member is disposed above an exhaust unit of the processing chamber.

<Supplementary Note 13>

In the substrate processing apparatus of any one of Supplementary notes 1 and 2, preferably,
the plurality of second heating units are concentrically installed with respect to each other.

<Supplementary Note 14>

In the substrate processing apparatus of any one of Supplementary notes 1 and 2, preferably, the heater includes an outer circle portion and an inner circle portion, which are concentrically installed in a multiple manner with respect to each other, the outer circle portion is connected to the reinforcing member at a base end side, and the outer circle portion is connected to the inner circle portion at a front end side.

<Supplementary Note 15>

In the substrate processing apparatus of any one of Supplementary notes 1 through 14, preferably, the thermal insulation unit includes a notched portion where the suspending member inserted therein passes through, the notched portion extending over an entire length of the thermal insulation unit in a vertical direction.

<Supplementary Note 16>

In the substrate processing apparatus of any one of Supplementary notes 1 and 2, preferably, the heater has cardioid shape (heart shape).

<Supplementary Note 17>

In the substrate processing apparatus of Supplementary note 16, preferably, the suspending member is disposed at a center portion of the heater.

<Supplementary Note 18>

In the substrate processing apparatus of Supplementary note 2, preferably, the diameter of the heater ranges from one-fifth to three-fifth of that of the substrate.

<Supplementary Note 19>

In the substrate processing apparatus of Supplementary note 18, preferably, the diameter of the heater ranges from three-tenth to eight-fifteenth of that of the substrate.

<Supplementary Note 20>

In the substrate processing apparatus of any one of Supplementary notes 1 through 19, preferably, the diameter of the heater is a value capable of heating a position at which an surface temperature distribution of a lowermost substrate is uniform.

<Supplementary Note 21>

According to another aspect of the present invention, there is provided a substrate processing method or a method of manufacturing a semiconductor device including:

(a) loading a substrate support disposed above a thermal insulation unit and supporting a substrate into a processing chamber;

(b) heating an inside of the processing chamber by a first heating unit disposed around the processing chamber and a second heating unit disposed between the substrate support and the thermal insulation unit inside the processing chamber, the second heating unit including a heater having a substantially annular shape and a suspending member extending downward from the heater; and (c) supplying a process gas into the processing chamber, wherein a bottom region of the processing chamber is heated in the step (b) by the heater having a diameter of the heater is smaller than that of the substrate.

<Supplementary Note 22>

According to still another aspect of the present invention, there is provided a program or a non-transitory computer-readable recording medium storing a program for causing a computer to control a substrate processing apparatus to perform:

(a) loading a substrate support disposed above a thermal insulation unit and supporting a substrate into a processing chamber;

(b) heating an inside of the processing chamber by a first heating unit disposed around the processing chamber and a second heating unit disposed between the substrate support and the thermal insulation unit inside the processing chamber, the second heating unit including a heater having a substantially annular shape and a suspending member extending downward from the heater; and (c) supplying a process gas into the processing chamber, wherein a bottom region of the processing chamber is heated in the step (b) by the heater having a diameter of the heater is smaller than that of the substrate.

<Supplementary Note 23>

According to still another aspect of the present invention, there is provided a heating unit disposed between a substrate support configured to support a substrate and a thermal insulation unit disposed below the substrate support, the heating unit including:

a heater having a substantially annular shape; and a suspending member extending downward from the heater, wherein a diameter of the heater is smaller than that of the substrate.

<Supplementary Note 24>

According to still another aspect of the present invention, there is provided a substrate processing apparatus including:

a substrate support configured to support a substrate;

a thermal insulation unit disposed below the substrate support;

a reaction tube including a processing chamber where the substrate is processed;

a first heating unit disposed around the reaction tube; and a second heating unit having a substantially annular shape and disposed between the substrate support and the thermal insulation unit, the second heating unit configured to heat a radial direction portion of a lower region of the processing chamber, wherein a diameter of the second heating unit is smaller than that of the substrate.

<Supplementary Note 25>

According to still another aspect of the present invention, there is provided a substrate processing method or a method of manufacturing a semiconductor device including:

(a) loading a substrate support supporting a substrate into a processing chamber;

(b) heating an inside of the processing chamber by a first heating unit and a second heating unit;

(c) supplying a process gas into the processing chamber and exhausting the process gas from the processing chamber; and (d) unloading the substrate support from the processing chamber, wherein an annular portion of a lower region of the processing chamber having a diameter smaller than that of the substrate is heated in a annular shape from a lower side of the substrate support by the second heating unit in (b).

What is claimed is:

1. A substrate processing apparatus comprising:
a substrate support that supports a substrate;
a thermal insulation unit disposed below the substrate support;
a processing chamber that accommodates the substrate support and where the substrate is processed;
a first heating unit disposed around the processing chamber that heats an inside of the processing chamber from a lateral side thereof; and
a second heating unit disposed under the substrate support inside the processing chamber, the second heating unit comprising:

a tubular heater portion having a circular arc shape with a hollow center, the tubular heater portion having a diameter smaller than a diameter of the substrate;
a tubular suspending portion connected to the tubular heater portion and extending downward from the tubular heater portion;
a V-shaped tubular portion interposed between the tubular heater portion and the tubular suspending portion to connect two ends of the tubular heater portion to one end of the tubular suspending portion; and
a heating element encapsulated in the tubular heater portion.

2. The substrate processing apparatus of claim 1, wherein the diameter of the tubular heater portion ranges from one-fifth to three-fifths of the diameter of the substrate.

3. The substrate processing apparatus of claim 1, further comprising a temperature measuring member being in contact with a surface of the tubular heater portion.

4. The substrate processing apparatus of claim 3, wherein the second heating unit further comprises a temperature measuring member support installed at the tubular heater portion, and the temperature measuring member support fixes the temperature measuring member to the surface of the tubular heater portion.

5. The substrate processing apparatus of claim 4, further comprising a spacer installed on an upper surface of the thermal insulation unit below the tubular heater portion with a gap between the spacer and the tubular heater portion.

6. The substrate processing apparatus of claim 1, wherein the first heating unit comprises: an upper heater that heats an upper region of the processing chamber where the substrate support is accommodated; and a lower heater that heats a lower region of the processing chamber where the thermal insulation unit is accommodated, and the tubular heater portion is installed equal to or higher than a boundary between the upper heater and the lower heater.

7. The substrate processing apparatus of claim 6, wherein a temperature of the tubular heater portion is equal to or lower than a temperature of the lower heater.

8. The substrate processing apparatus of claim 1, wherein the thermal insulation unit comprises a notched portion where the tubular suspending portion inserted therein passes through, the notched portion extending over an entire length of the thermal insulation unit in a vertical direction.

9. The substrate processing apparatus of claim 1, wherein the second heating unit is disposed between the substrate support and the thermal insulation unit.

10. The substrate processing apparatus of claim 1, wherein the heating element comprises a coiled resistive heating element.

* * * * *